(12) United States Patent
Hirano

(10) Patent No.: US 6,483,752 B2
(45) Date of Patent: Nov. 19, 2002

(54) ERASE METHOD FOR NONVOLATILE SEMICONDUCTOR MEMORY DEVICE

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/898,022

(22) Filed: Jul. 5, 2001

(65) Prior Publication Data

US 2002/0008996 A1 Jan. 24, 2002

(30) Foreign Application Priority Data

Jul. 5, 2000 (JP) .......................... 2000-203869

(51) Int. Cl.[7] .............................................. G11C 16/04
(52) U.S. Cl. ......................... 365/185.33; 365/185.22; 365/185.17
(58) Field of Search ..................... 365/185.33, 185.22, 365/185.17

(56) References Cited

U.S. PATENT DOCUMENTS 5,422,843 A 6/1995 Yamada 6,172,909 B1 * 1/2001 Haddad et al. ........ 365/185.19

FOREIGN PATENT DOCUMENTS

| JP | 5-182481 | 7/1993 |
| JP | 6-29499 | 2/1994 |
| JP | 6-119789 | 4/1994 |

* cited by examiner

Primary Examiner—Huan Hoang
(74) Attorney, Agent, or Firm—Morrison & Foerster LLP

(57) ABSTRACT

In an erase method for a nonvolatile semiconductor memory device in which a memory cell array is divided into blocks, an erase pulse application for erasing information, a first verify operation for verifying a threshold voltage shift due to the erase pulse application and a second verify operation for verifying whether excessive erasure has occurred due to the erase pulse application are performed for memory cells connected to one word line in a certain block. When a memory cell excessively erased is found by the second verify operation, a soft program operation for the memory cell is performed after the second verify operation. The erase pulse application, the first verify operation, and the second verify operation are executed word line by word line in the block.

11 Claims, 16 Drawing Sheets

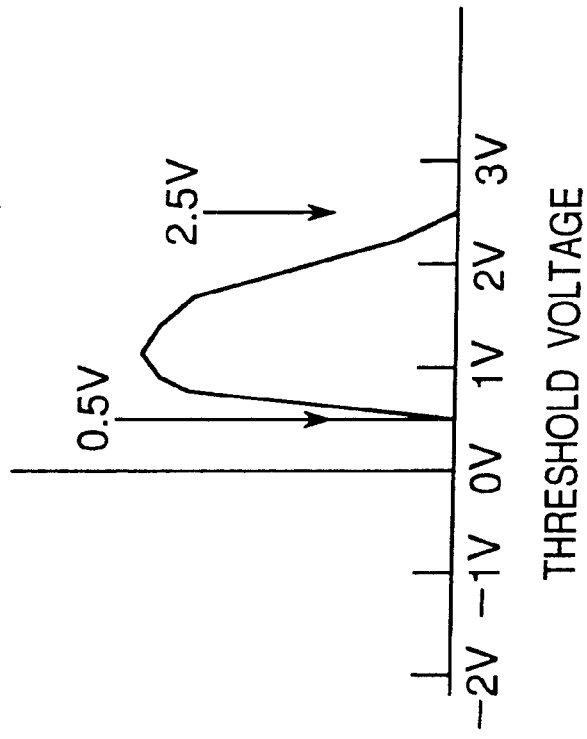
Fig.6A  IMMEDIATELY AFTER ERASE PULSE APPLICATION
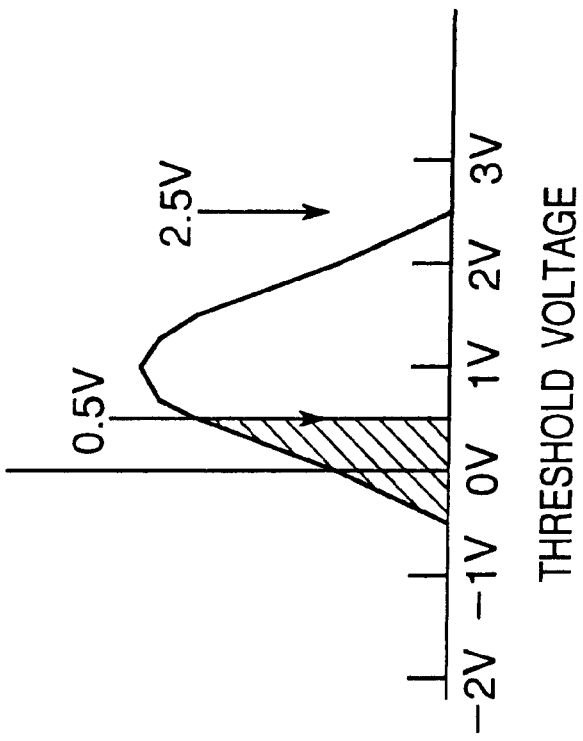
Fig.6B  AFTER SOFT PROGRAM

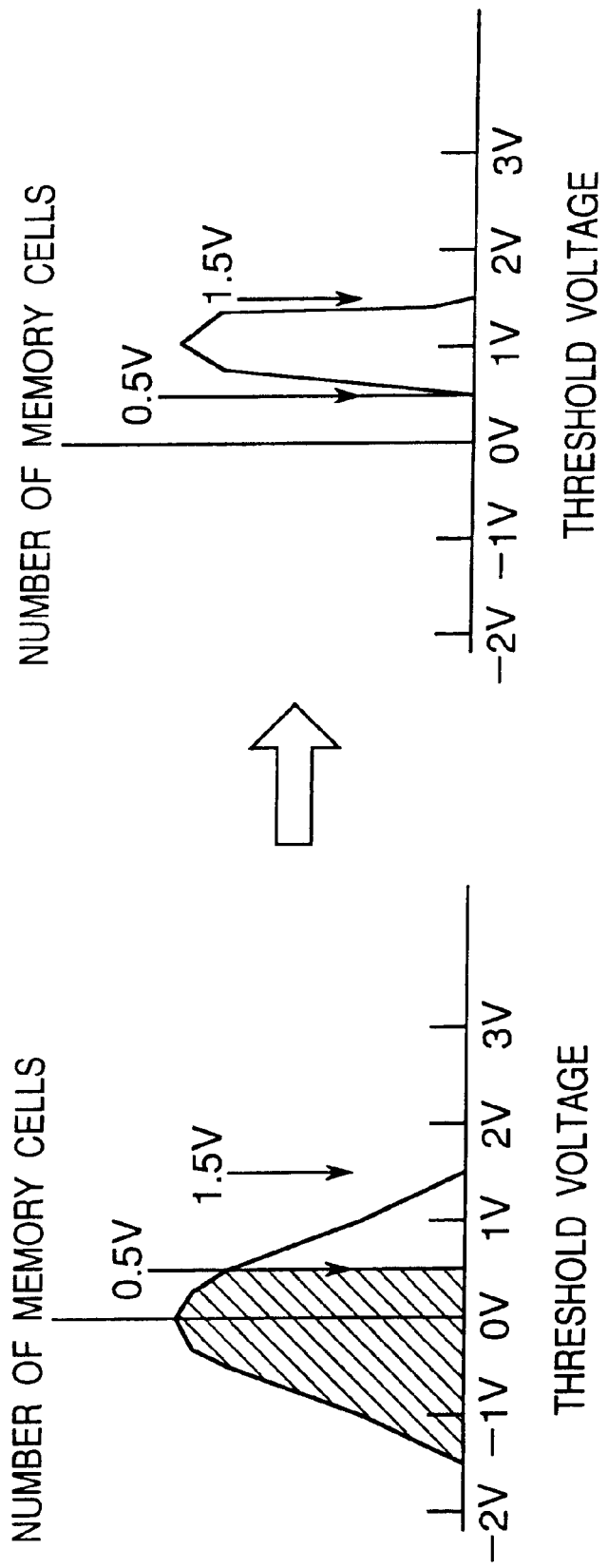

ERASE METHOD FOR NONVOLATILE SEMICONDUCTOR MEMORY DEVICE

BACKGROUND OF THE INVENTION

The present invention relates to an erase method for nonvolatile semiconductor memory devices, and in particular, to an erase method for a nonvolatile semiconductor memory device in which threshold voltages of memory cells in an erased state are lower than threshold voltages of memory cells in a written state.

One of most widely used flash memories is a flash memory of ETOX (a registered trademark of Intel Corp.) type, a memory cell of which has a basic structure as shown in FIG. 11. The memory cell of this basic structure has a source 12 and a drain 13 formed on a surface of a substrate (well) 11. Above a channel region 14 located between the source and the drain, a floating gate FG is formed with the interposition of a tunnel oxide film 15, and a control gate CG is further formed with the interposition of an interlayer insulation film 16.

The principle of operation of the flash memory of ETOX type will be described. As shown in Table 1, during a write (program) operation, there are applied a voltage Vpp (10 V, for example) to the control gate CG, a reference voltage Vss (0 V, for example) to the source 12, and a voltage of 6 V to the drain 13. It is to be noted that the drain application voltage of "6 V/0 V" in Table 1 means the application of a voltage of 6 V to the drain of a selected memory cell and the application of a voltage of 0 V to the drain of a non-selected memory cell.

TABLE 1

Conventional Applied Voltages in Various Modes

|  | Control Gate | Drain | Source | Substrate |
|---|---|---|---|---|
| Write (Program) | 10 V | 6 V/0 V | 0 V | 0 V |
| Erase | −9 V | Open | 4 V | 0 V |
| Read | 5 V | 1 V | 0 V | 0 V |

With this arrangement, a large current flows through the channel region 14 of a memory cell as shown in FIG. 12, and channel hot electrons (CHE) are generated in a drain-side portion where the electric field is high. The generated electrons are injected into the floating gate FG, and the threshold voltage of the memory cell rises. The threshold voltage distribution of memory cells in the written state has a mean value of 5.0 V and a lower limit of 4.5 V. This is shown in FIG. 10.

As shown in Table 1, during an erase operation, there are applied a voltage Vnn (−9 V, for example) to the control gate CG and a voltage Vpe (4 V, for example) to the source 12. Then, as shown in FIG. 13, the drain 13 is opened to extract electrons at the source side, thereby lowering the threshold value of the memory cell (source side erase). The threshold voltage distribution of the memory cells in the erased state has an upper limit of 2.5 V and a lower limit of 0.5 V, as shown in FIG. 10. During this erase operation, a BTBT (Band To Band Tunneling) current flows, and hot holes and hot electrons are generated at the same time. Among these, the hot electrons flow to the drain 13, whereas the hot holes are pulled to the tunnel oxide film side and trapped in the tunnel oxide film. It is generally said that this phenomenon degrades the reliability.

As shown in Table 1, during a read (readout) operation of a memory cell, there are applied a voltage of 1 V to the drain 13 and a voltage of 5 V to the control gate CG. When the memory cell is in the erased state with a low threshold voltage, a current flows through the memory cell, and this state is determined to be "1". When the memory cell is in the written state with a high threshold voltage, no current flows through the memory cell, and this state is determined to be "0".

The aforementioned operating method has a problem that the reliability of the memory cell is deteriorated by the band to band tunneling current generated through the source side erase operation. As a measure for solving this problem, there is a method of executing "channel erase" by which no band to band tunneling current is generated. In order to execute this channel erase operation, there is employed a memory cell having a triple well structure in which an N-well is arranged outside a P-well, as shown in FIG. 16. In the memory cell of this triple well structure, an N-well 22 is formed on the surface of a P-type substrate 21, and a P-well 23 is formed in this N-well 22. Further, a source 24 and a drain 25 are formed at a surface of the P-well 23. A floating gate FG is formed on a channel region 26 located between the source and the drain via a tunnel oxide film (not shown), and a control gate CG is further formed via an interlayer insulation film (not shown).

Table 2 shows applied voltages in each mode for the memory cell of the triple well structure. As shown in Table 2, the write operation and the read operation for the memory cell of this triple well structure are executed on the same voltage application conditions as those for the memory cell of the aforementioned basic structure (FIG. 11). FIG. 17 shows the write operation by channel hot electrons. In this case, in addition to the voltage application conditions of FIG. 12 there are further applied a voltage of 3 V to the N-well 22 and a voltage of 0 V to the substrate 21 and the P-well 23.

TABLE 2

Conventional Applied Voltages in Various Modes

|  | Control Gate | Drain | Source | P-well |
|---|---|---|---|---|
| Write (Program) | 10 V | 6 V/0 V | 0 V | 0 V |
| Erase | −9 V | Open | 7 V | 7 V |
| Read | 5 V | 1 V | 0 V | 0 V |

When executing channel erase in the memory cell of the triple well structure, as shown in FIG. 18, there are applied a voltage Vnn (−9 V, for example) to the control gate CG (word line) and a voltage Vesc (+7 V, for example) to the source 24 and the N-well 22. By this operation, an intense electric field is applied to the tunnel oxide film located between the channel region 26 and the floating gate FG, and electrons are extracted from the floating gate FG to the channel region 26 by the Fowler-Nordheim tunneling phenomenon, with the result that the threshold voltage lowers. At this time, the potential of the source 24 and the potential of the P-well 23 are equal to each other. Therefore, no electric field is concentrated on the boundary between the source 24 and the P-well 23, and the band to band tunneling current is not generated. Consequently, hot holes are neither generated nor trapped, and the reliability of the memory cell is improved.

FIG. 14 shows an array structure of the flash memory that employs the aforementioned memory cells. As is apparent from the figure, the array structure is a NOR type array structure. When a threshold voltage distribution as shown in FIG. 10 is provided in the above array structure, there is a problem as follows.

Basically, the threshold voltage distribution after the channel erase becomes a distribution similar to that labeled erased state in FIG. 10. A case where characteristic change occurs after repeated erase and write operations will be discussed. For example, assume that the threshold voltage of a memory cell M127 bearing the mark o in FIG. 14 was subjected to excessive erasure and made to have a negative threshold voltage (−0.3 V, for example), and that a memory cell M01 bearing the mark Δ was put into a written state (for example, the threshold voltage was set to 4.5 V). In this case, when reading the data of the memory cell M01 bearing the mark Δ, no current flows since the memory cell M01 bearing the mark Δ has a very high threshold voltage of not lower than 4.5 V. However, since the threshold voltage of the memory cell M127 bearing the mark o has a negative value, a current flows even in a non-selected state, i.e., even when a word line WL127 has a voltage of 0 V. Therefore, if a current flowing through a bit line BL0 is detected by applying a voltage of 1 V to the bit line BL0, then the data of the memory cell M01 bearing the mark Δ is determined to be "1" (a state in which the threshold voltage is low), which is a misread. As understood from this fact, the NOR (non-disjunction) type flash memory is not permitted to have a negative threshold voltage in the array.

An erase algorithm as shown in FIG. 15 is used as a method for solving the aforementioned problem in the flash memory (see, for example, Japanese Patent Laid-Open Publication No. HEI 5-182481). According to this erase algorithm, a batch erase operation is executed in blocks. Specifically, when the erase operation of a certain block starts, the write operation is first executed in all the memory cells in the block (pre-erase program S501). By this operation, the threshold voltages of the memory cells in the block all come to have a high threshold voltage (not lower than 4.5 V, for example). Subsequently, an erase pulse is applied to all the memory cells in the block (S502). The erase pulse application is executed either by the source side erase method or by the channel erase method. This erase pulse application continues while verifying the threshold voltage through a verify operation until all the memory cells come to have a specified value (2.5 V, for example) (S503 through S506). Next, it is confirmed whether there is a memory cell that has a negative threshold voltage in the block. Practically, it is confirmed whether there is a threshold voltage of not higher than 0.5 V (S507). If there is a memory cell that has a negative threshold voltage in the array, a soft program operation (write to a slight degree) is executed for all the memory cells connected to a bit line to which the memory cell having a negative threshold voltage is connected (S508). For example, in the case of a memory cell of the basic structure as shown in FIG. 19, the voltage application conditions of the soft program operation are: a voltage of 6 V applied to the control gate CG (word line), a voltage of 6 V applied to the drain 13 (bit line) and a voltage of 0 V applied to the source 12 (source line). In the case of a memory cell of the triple well structure as shown in FIG. 20, the voltage application conditions of the soft program operation are: a voltage of 6 V to the control gate CG (word line), a voltage of 6 V to the drain 25 (bit line), a voltage of 0 V to the source 24 (source line), a voltage of 0 V to the P-well 23 and a voltage of 3 V to the N-well 22. The soft program operation causes channel hot electrons, and electrons are thus injected into the floating gate FG to thereby slightly raise the threshold voltage. The soft program operation and the verify operation are repeated until memory cells that have a negative threshold voltage disappear from the block and the threshold voltages of all the memory cells become a positive threshold voltage (practically higher than 0.5 V) (S509 through S511 in FIG. 15). Thus, the block has no memory cells that have a negative threshold voltage.

With reduction in dimensions of the memory cells due to finer patterns and the use of the channel erase technique, it can be predicted that the variations in the threshold voltage distribution in the erased state will be increased. When the variations are increased, the above-described erase algorithm will present a problem.

For example, in the NOR type memory cell array as shown in FIG. 14, it is assumed that the threshold voltage of the memory cell M01 bearing the mark Δ has a negative value (−2 V, for example), although a majority of the threshold voltages of the memory cells are distributed in the positive region as shown in, for example, FIG. 8. For example, in order to execute the verify operation of the memory cell M00 bearing the mark □ shown in FIG. 14, the word line WL0 is selected to sense and amplify the flowing current by a sense amplifier circuit (not shown) connected to the bit line BL0. At this time, a voltage of 0 V is applied to a word line WL1 since the word line WL1 is not selected. However, since the threshold voltage of the memory cell M01 bearing the mark Δ has a negative threshold voltage, a current disadvantageously flows through the memory cell M01. Therefore, it is disadvantageously determined that the memory cell M00 has a negative threshold voltage, regardless of the value of the threshold voltage of the memory cell M00 bearing the mark □. Subsequently, if the verify operation is executed by sequentially selecting the memory cells, then a similar determination is to be made with regard to all the memory cells whose drains are connected to the bit line BL0. Therefore, the soft program operation is executed for the memory cells whose drains are connected to the bit line BL0. In this case, even when the memory cell M00 bearing the mark □ actually has a threshold voltage of 2.5 V, so long as the threshold voltage of the memory cell M01 has a negative value, the soft program operation is repetitively executed due to the erroneous detection during the verify operation. This operation is continued until the threshold voltage of the memory cell M01 becomes a positive threshold voltage (practically until the threshold voltage becomes higher than 0.5 V).

In this case, the memory cell M01 bearing the mark A has a very low threshold voltage of −2 V. Therefore, assuming that five soft program pulses of 1μs are applied, then the five pulses are similarly applied to the memory cell M00 bearing the mark □. As a result of the soft program pulse application, the memory cell M00 bearing the mark □, which had a threshold voltage of 2.5 V before the pulse application, comes to have a threshold voltage increased to higher than 2.5 V. In the worst case, the data which is originally "1" corresponding to the low threshold may be erroneously read as data "0" (which corresponds to the high threshold voltage).

Next, it is assumed that the ratio of the memory cells in an excessively erased (overerase) state is great in a certain block as shown in FIG. 9 and a majority of the memory cells whose drains are connected to a certain bit line have a negative threshold voltage. If it is attempted to execute the soft program operation to the memory cells whose drains are connected to the certain bit line, then the program operation results unsuccessful as a consequence of the occurrence of the following phenomenon. That is, assuming that the memory cells connected to one bit line represent 128 bits (128 memory cells) and 60 bits (60 memory cells) among them have a negative threshold voltage, then the current caused by the voltage (6 V, for example) applied to the bit line is delivered to 60 memory cells in parallel in order to execute the soft program. This large current disadvantageously makes the bit line voltage drop due to the bit line resistance and the like, as a consequence of which the soft program cannot be executed.

To sum up, the following two problems occur when the threshold voltage distribution of the memory cells in the block to be erased varies.

(1) If a memory cell having a negative threshold voltage exists in the block, then erroneous detection occurs during the verify operation for other memory cells. Therefore, the threshold voltage of the memory cell in which the data "1" is originally written disadvantageously rises due to the erroneous execution or continuation of the soft program operation, and this disadvantageously leads to the occurrence of the misread that the data is "0".

(2) When many memory cells having a negative threshold voltage exist among the memory cells connected to an identical bit line, the soft program cannot be executed due to the voltage drop of the bit line.

As described above, in the nonvolatile semiconductor memory in which the intra-block batch erase is executed, the spread of the threshold voltage distribution of the memory cells in the block causes a serious problem. When the aforementioned source side erase operation is employed, the spread of the threshold voltage distribution attributed to the deterioration in reliability due to the trap of hot holes in the tunnel oxide film is, of course, a problem. Furthermore, a reduction of the memory cell area by making patterns finer becomes indispensable as the packing density and capacity of the nonvolatile semiconductor memory progress in the future, and therefore, the spread of the threshold voltage distribution of the memory cells causes a problem even when the channel erase technique is used.

Techniques avoiding these problems by reducing the unit of erase are disclosed in Japanese Patent Laid-Open Publication Nos. HEI 6-29499 and HEI 6-119789.

According to the technique taught by Japanese Patent Laid-Open Publication No. HEI 6-29499, as shown in FIG. 21, memory cells connected to one word line (for example, WL0) are connected to one source line (SL0 for WL0). The source line SL0 is separated from source lines SL1, . . . , SL127 connected to the other word lines WL1, WL127. Then, the memory cells M00, M10, . . . connected to this one word line WL0 constitute a block as one unit of erase. According to this system, there is only one memory cell connected to one bit line in one block of memory cells M00, M10, . . . even if the intra-block batch erase is executed. Therefore, the aforementioned two problems do not occur.

However, in this case, the unit of erase is small, and if a word line load capacitance, a load resistance and so on are taken into consideration, the unit of erase is disadvantageously reduced to a unit of about 1 KB, i.e., 8 kbit. When many memory cells are desired to be erased, it is required to issue the command many times, and this disadvantageously increases the load of the system. In a digital still camera or the like, the amount of data necessary for one photograph or the like tends to increase, and the unit of erase should preferably be large in such a case.

On the other hand, according to the technique taught by Japanese Patent Laid-Open Publication No. HEI 6-119789, as shown in FIG. 22, memory cells connected to a word line WL0 and memory cells connected to a word line WL1 have a common source line SL0. These memory cells constitute one block as a unit of erase. In this case, when the erase operation starts, an erase pulse is applied to the memory cells connected to the word line WL0. Specifically, there are applied a voltage of, for example, −9 V to the word line WL0 and a voltage of, for example, 5 V to the source line SL0, and the bit line is put into an open state. At this time, the word line WL1 has a voltage of, for example, 0 V, and basically no erase pulse is applied to the word line WL1. Next, the word line WL0 is made to have a voltage of 0 V, and no erase pulse is applied thereto. On the other hand, there are applied a voltage of, for example, −9 V to the word line WL1 and a voltage of, for example, 5 V to the source line SL0, and the bit line is put into the open state, with the erase pulse applied to the word line WL1. That is, according to this method, the spread of the threshold voltage distribution is narrowed by independently applying the erase pulse to the memory cells connected to the word line WL0. However, this method has the following problems.

(1') Since no soft program operation is used after the erase pulse application, misread occurs if the threshold voltage has a negative value, as in the case of the foregoing prior art. Even if a soft program operation is used, since the unit of erase includes two memory cells connected to one bit line, misread occurs. That is, assuming that one memory cell has a threshold voltage of −2 V and the other memory cell has a threshold voltage of 2.5 V, when the soft program operation is executed after the erase pulse application, the threshold voltage of the memory cell that had the threshold voltage of 2.5 V surely becomes higher than 2.5 V, and finally a misread occurs.

(2') The unit of erase includes only two word lines and corresponds to, for example, about 2 KB (merely doubled as compared with that of FIG. 21). Therefore, it is required to input the erase command many times when erasing the large capacity, and the system load is increased.

SUMMARY OF THE INVENTION

The object of the present invention is to provide an erase method for a nonvolatile semiconductor memory device which, in performing an erase operation block by block, is capable of:

(1") correctly completing the erase operation even if the threshold voltage distribution of memory cells in a block varies while preventing the occurrence of misread; and (2") correctly executing a soft program operation even if there are many memory cells that have a negative threshold voltage among the memory cells connected to an identical bit line, without changing the general memory cell array structure.

In order to accomplish the above object, according to an aspect of the present invention, there is provided an erase method for a nonvolatile semiconductor memory device, the memory device comprising electrically erasable and programmable floating gate field-effect transistors arranged in a matrix form so as to form a memory cell array, each memory cell having a control gate, a drain and a source, a plurality of word lines connected to the control gates of memory cells in each row, and a plurality of bit lines connected to the drains of memory cells in each column, the memory cell array being divided into a plurality of blocks including the memory cells of a plurality of rows and a plurality of columns, the sources of the memory cells in each block being commonly connected, and the memory cells in each block being connected together in a NOR type form. The erase method which executes an erase operation in blocks comprises:

executing, for the memory cells connected to one word line in a certain block, an erase pulse application for erasing information, a first verify operation for verifying a threshold voltage shift due to the erase pulse application and a second verify operation for verifying whether excessive erasure has occurred due to the erase pulse application, and when a memory cell that has undergone excessive erasure is found by the second verify operation, executing a soft program operation for the memory cell after the second verify operation, the erase pulse application, the first verify operation, and the second verify operation being executed word line by word line in the block.

Note that the term "soft program operation" used herein means a slight write operation that causes a smaller threshold voltage shift than when a full write (program) operation is performed.

The erase method of the present invention carries out, for the memory cells connected to one word line passing through a certain block, the erase pulse application for erasing information, the first verify operation for confirming a threshold voltage shift due to the erase pulse application, and the second verify operation for confirming the fact that no excessive erasure (overerase) due to the erase pulse application has occurred. Furthermore, when a memory cell that has undergone excessive erasure is found through the second verify operation as a consequence of the variation in the threshold voltage distribution of the memory cells in the block due to the erase pulse application, the soft program operation is executed in the memory cell. In this case, the second verify operation is executed every word line, and therefore, only one memory cell that has undergone excessive erasure is specified per bit line. Therefore, the soft program operation is executed only for the single memory cell that has undergone excessive erasure, and the soft program operation is not executed for memory cells that have not undergone excessive erasure. Therefore, the soft program is correctly executed even if there are memory cells that have a negative threshold voltage among the memory cells connected to an identical bit line. As a result, the threshold voltage of the memory cell that has undergone excessive erasure can be shifted to fall within a target range (tolerance prescribed with regard to the threshold voltage of the memory cell in the erased state), and the threshold voltage of the memory cell that has not undergone excessive erasure can be kept intact at the value. By executing a series of operations of the erase pulse application, the first verify operation, the second verify operation and the soft program operation sequentially word line by word line on a plurality of word lines that extend through a block, the threshold voltages of the memory cells in the block can be made to fall in the target range. Therefore, even if the threshold voltage distribution of the memory cells in the block varies, the erase operation can be completed correctly. Therefore, misread after the erase operation is prevented.

In one embodiment, a target range of threshold voltages of each memory cell in an erased state is set lower than a lower limit value of threshold voltages in a written state. And, the first verify operation verifies that the threshold voltages of the memory cells connected to the word line are equal to or lower than an upper limit value of the target range. Also, the second verify operation verifies that the threshold voltages of the memory cells connected to the word line are equal to or higher than a lower limit value of the target range.

The soft program operation may be executed by means of channel hot electrons. In that case, the soft program operation can successfully be done bit by bit even when the memory cells in the block are connected to form a NOR type memory cell array.

In one embodiment, the soft program is performed using the following voltage application conditions. That is, a voltage applied to the control gate of a memory cell in the soft program operation is same in polarity as and smaller in value than a voltage applied to the control gate of the memory cell during a write operation. Also, a voltage applied to the drain of the memory cell in the soft program operation is substantially identical to a voltage applied to the drain of the memory cell in the write operation.

In one embodiment, the erase pulse application includes applying a first voltage to the sources of a certain block, applying a second voltage to one word line selected from the plurality of word lines of the block, and applying a third voltage to non-selected word lines of the block, to thereby extract electrons from the floating gate to the source of each memory cell connected to the selected word line. The first voltage may be a positive voltage, the second voltage may be a negative voltage and the third voltage may be a reference voltage.

In one embodiment, each memory cell constituted of the floating gate field-effect transistor has a triple well structure in which a P-well that provides a channel region is formed via an N-well on a P-type semiconductor substrate. In this case, the erase pulse application includes applying a first voltage to the source and the P-well of a certain block, applying a second voltage to one word line selected from the plurality of word lines of the block, and applying a third voltage to non-selected word lines of the block, to thereby extract electrons from the floating gate to the channel region of each memory cell connected to the selected word line. The first voltage may be a positive voltage, the second voltage may be a negative voltage and the third voltage may be a reference voltage or a positive voltage lower than the first voltage.

An erase method according to a second aspect of the present invention is used for a nonvolatile semiconductor memory device that comprises electrically erasable and programmable floating gate field-effect transistors arranged in a matrix form so as to form a memory cell array, each memory cell having a control gate, a drain and a source, a plurality of word lines connected to the control gates of memory cells in each row, and a plurality of bit lines connected to the drains of memory cells in each column. Also, the memory cell array is divided into a plurality of blocks including the memory cells of a plurality of rows and a plurality of columns, each block is divided into a plurality of segments with respect to a row direction, each bit line consists of a main bit line and a plurality of sub-bit lines connected to the main bit line via a respective select transistor, the sub-bit lines are connected to the drains of the memory cells included in the corresponding segments, the sources of the memory cells in each block are commonly connected, and the memory cells in each block are connected together in a NOR type form.

In the erase method according to the second aspect of the present invention which executes an erase operation in blocks, an erase pulse application for erasing information, a first verify operation for verifying a threshold voltage shift due to the erase pulse application and a second verify operation for verifying whether excessive erasure has occurred due to the erase pulse application are executed for the memory cells connected to one word line in each segment of a certain block. If a memory cell that has undergone excessive erasure is found by the second verify operation, a soft program operation is performed for the memory cell after the second verify operation.

The erase pulse application, the first verify operation, the second verify operation, and the soft program operation are executed in the plurality of segments of the block in parallel, and also word line by word line in each segment of the block.

The erase method of the second aspect of the present invention enables an erase operation at a higher speed than the erase method of the first aspect.

In one embodiment, a target range of threshold voltages of each memory cell in an erased state is set lower than a lower limit value of threshold voltages in a written state. And, the first verify operation verifies that the threshold voltages of the memory cells connected to the word line are equal to or lower than an upper limit value of the target range. Also, the second verify operation verifies that the threshold voltages of the memory cells connected to the word line are equal to or higher than a lower limit value of the target range.

The first verify operation and the second verify operation for the memory cells connected to the selected word line may be executed by turning on the select transistors for the sub-bit lines included in the segment through which the selected word line extends while turning off the select transistors for the sub-bit lines included in remaining segments.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6A and 6B are graphs showing a change in a threshold voltage distribution by a soft program operation;

FIGS. 7A and 7B are graphs showing a change in a threshold voltage distribution by a soft program operation;

DETAILED DESCRIPTION OF THE PREFERRED EMBODIMENTS

The nonvolatile semiconductor memory device erase method of the present invention will be described in detail below on the basis of the embodiments thereof.

(First Embodiment)

Figure 4:
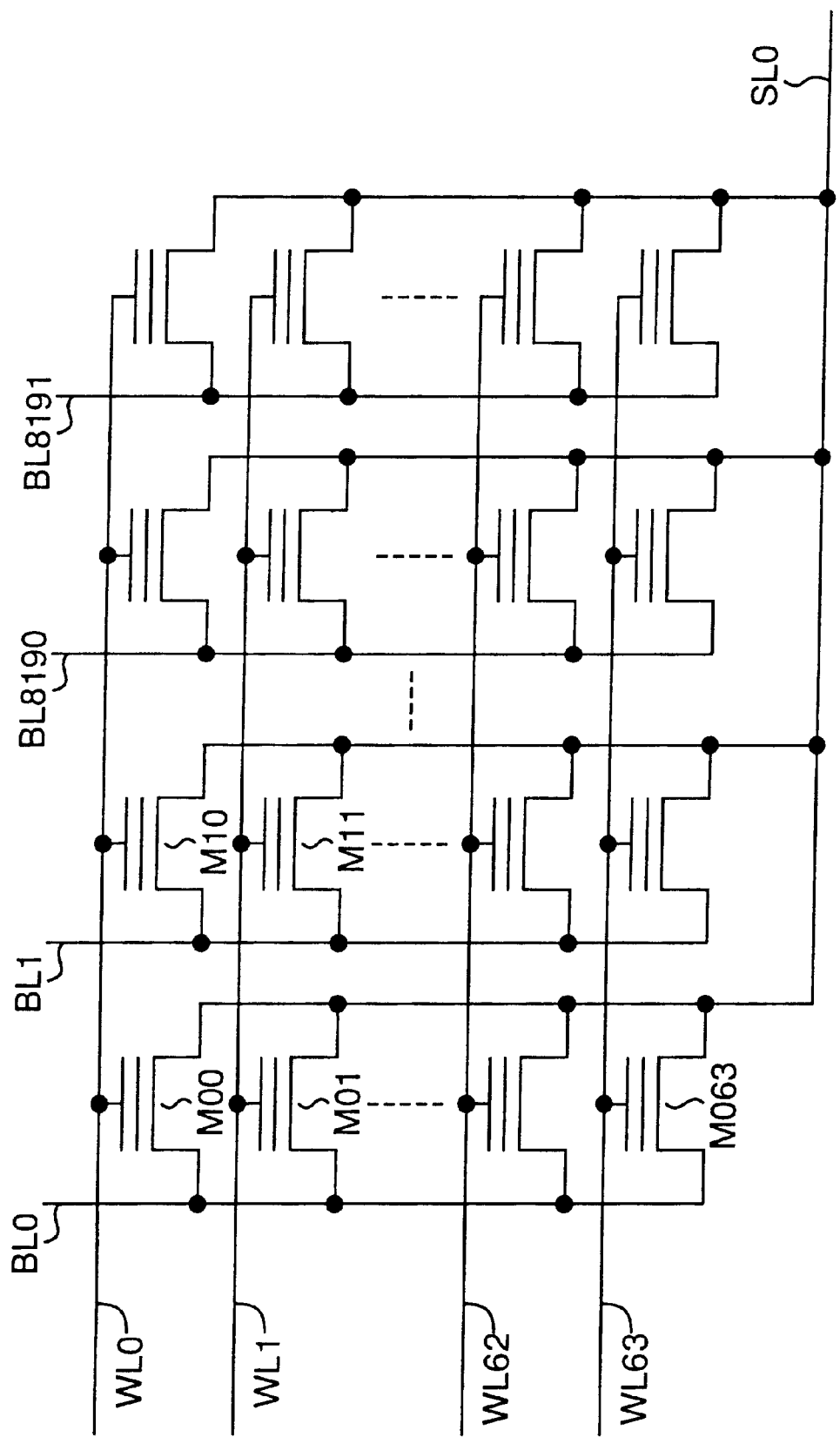
FIG. 4 is a diagram showing the array structure of a flash memory to which the erase operations of the first embodiment and the second embodiment of the present invention are to be applied.
Figure 14:
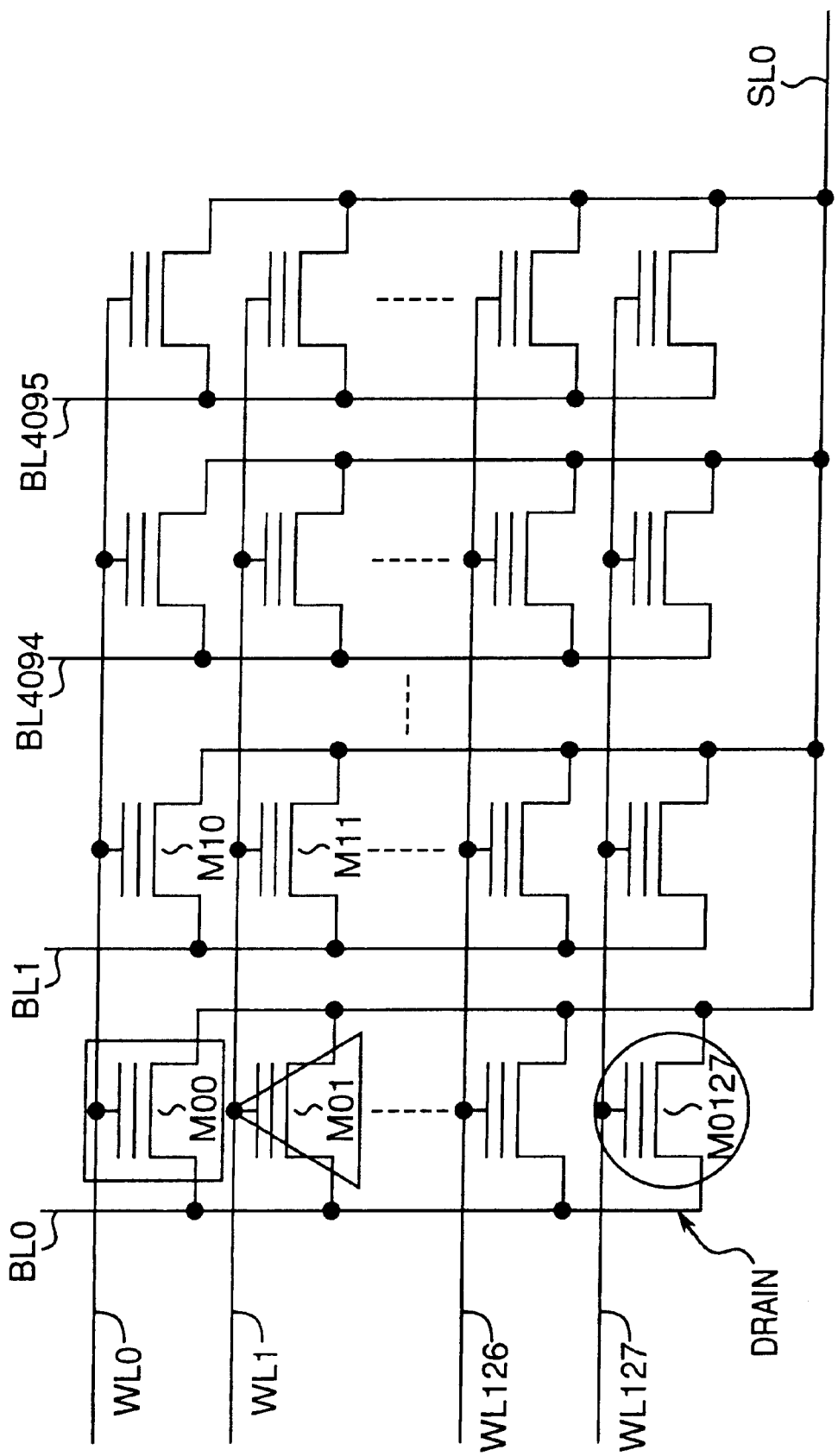
FIG. 14 is a diagram showing an array structure of a common flash memory.
Figure 15:
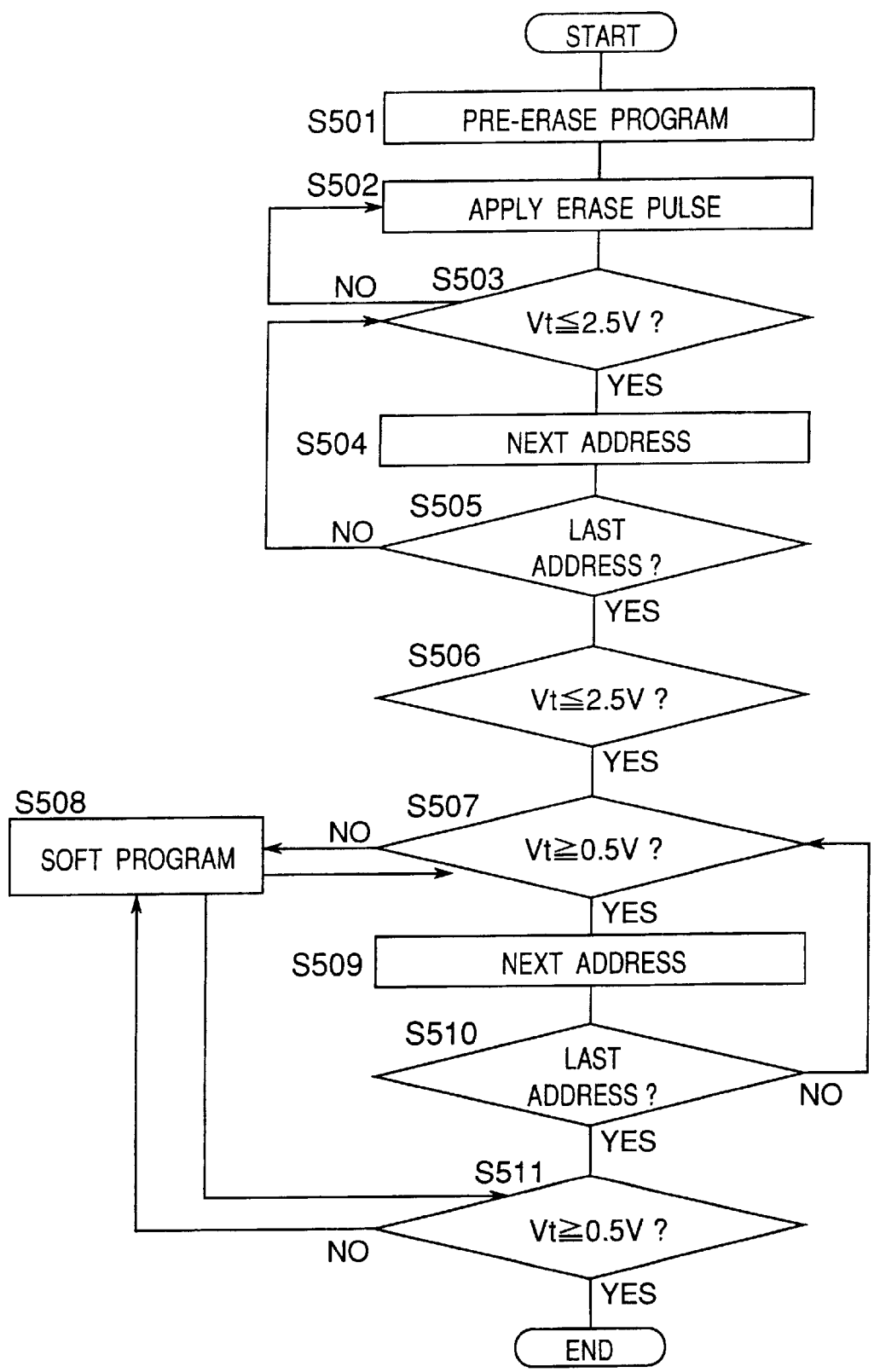
FIG. 15 is a flowchart showing the algorithm of the conventional erase operation.

FIG. 4 shows the array structure (of one block) of a flash memory that serves as a nonvolatile semiconductor memory device to which the erase method of the first embodiment is to be applied. Each block of this flash memory includes memory cells M00, M0, . . . , M063, M10, M11, . . . constructed of floating gate field-effect transistors arranged in a matrix form. Word lines WL0, WL1, . . . , WL63 are connected to the control gates CG of the memory cells in each row, while bit lines BL0, BL1, . . . , BL8191 are connected to the drains of the memory cells in each column. The sources of the memory cells are connected to a common source line SL0 in each block, and the memory cells in each block are connected together in a NOR type form. This block of 64 KB (512 kbit) constructed of 64 word lines and 8192 bit lines serves as a unit of erase. A block of 64 KB constructed of 128 word lines and 4096 bit lines as shown in FIG. 14 may serve as a unit of erase.

In this example, the memory cells M00, M01, . . . are of the type that has a basic structure similar to the structure shown in FIG. 11 (therefore, the following description will be made using the reference numerals shown in FIG. 11 for the sake of convenience) and each include a source 12 and a drain 13 formed on the surface of a substrate (well) 11. On a channel region 14 located between the source and the drain, a floating gate FG is formed with the interposition of a tunnel oxide film 15 therebetween, and a control gate CG is further formed with the interposition of an interlayer insulation film 16 between the gates FG and CG.

In an example, the write (i.e., program) operation, the erase operation and the read operation of the individual memory cells with the basic structure are executed under the application voltage conditions shown in Table 3 below according to a principle of operation similar to that described in connection with the background art.

TABLE 3

| | Control Gate | Drain | Source | P-well |
|---|---|---|---|---|
| Write (Program) | 10 V | 6 V/0 V | 0 V | 0 V |
| Erase | −9 V | Open | 4 V | 0 V |
| Read | 5 V | 1 V | 0 V | 0 V |
| Soft program | 6 V | 6 V/0 V | 0 V | 0 V |

Figure 19:
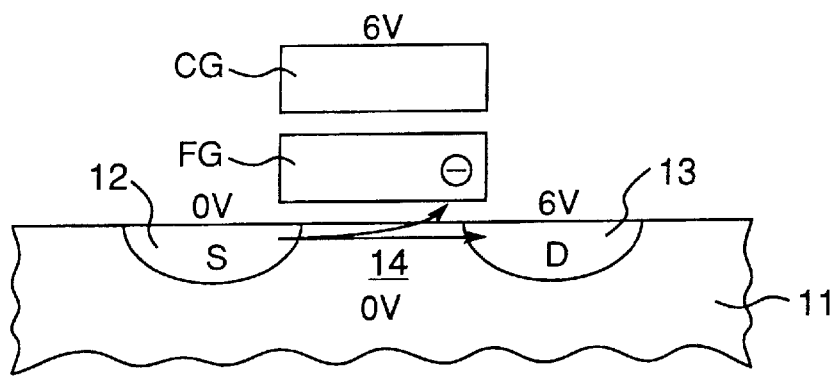
FIG. 19 is a diagram showing a soft program operation in the memory cell that has the basic structure.

The erase of the memory cell is the source side erase, as apparent from the item of "erase" in Table 3 indicating that there are applied a voltage of 4 V to the source and a voltage of 0 V to the P-well. The soft program operation applies a voltage of 6 V to the control gate CG (word line) of a selected memory cell, a voltage of 6 V to the drain 13 (bit line) and a voltage of 0 V to the source 12 (namely, to the common source line) similarly to the case shown in FIG. 19, thereby injecting channel hot electrons (CHE) into the floating gate FG of the memory cell and raising its threshold voltage. A voltage of 0 V is applied to the drains 13 (bit line) of non-selected memory cells (to which no soft program is executed).

Figure 1:
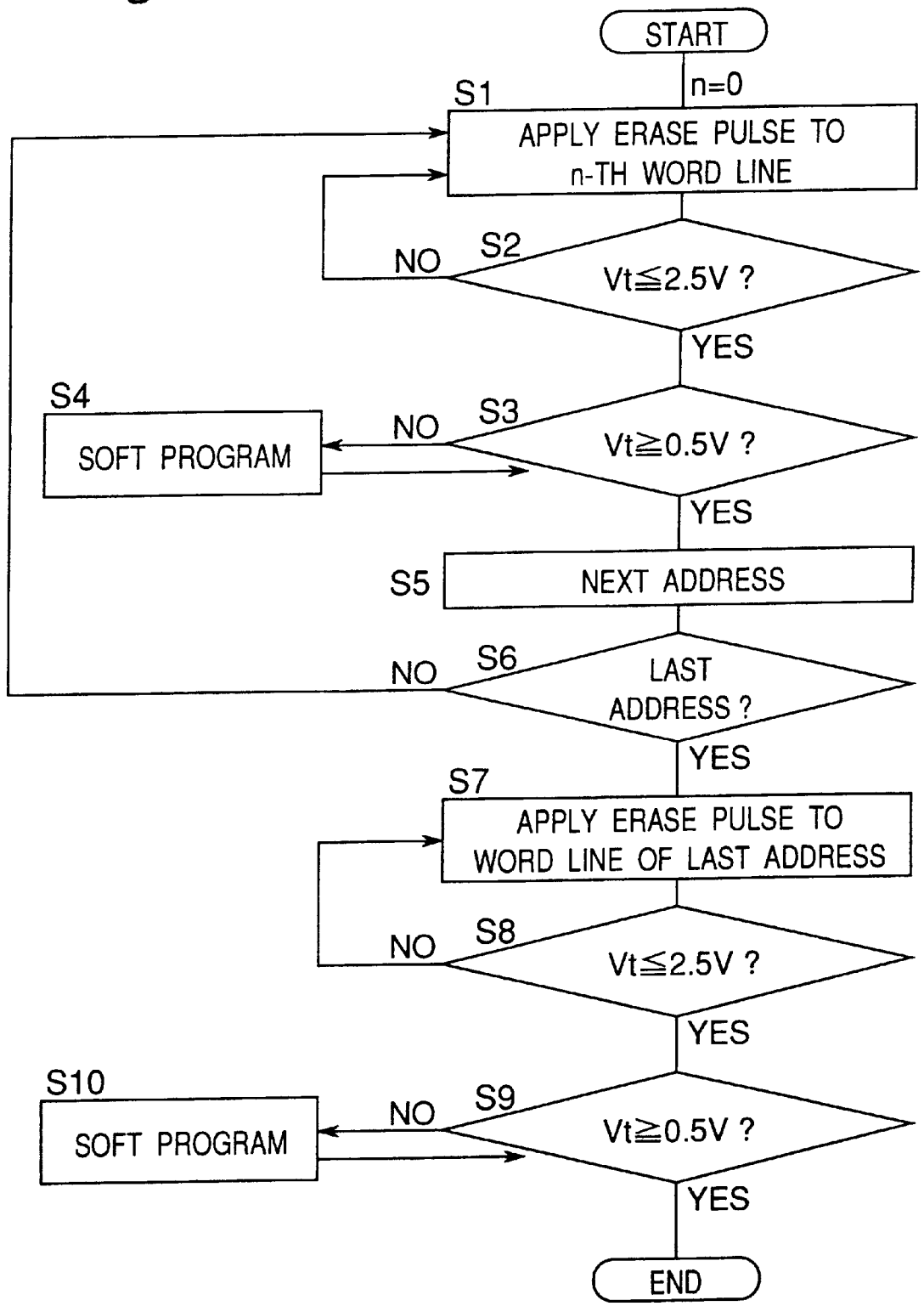
FIG. 1 is a flowchart showing an algorithm of an erase operation according to a first embodiment of the present invention.

FIG. 1 shows an algorithm of the erase operation of the first embodiment.

This flash memory is provided with a counter that indicates a word line address n, and the word lines are sequentially selected according to the address counter value n. In this case, the word line WL0 is first selected, and upon the completion of a series of steps of the erase operation described below for the word line WL0, the address counter value n is incremented by one to similarly execute the erase operation for the next word line WL1. Subsequently, the address counter value is incremented to execute a similar operation up to the word line WL63.

When the erase operation starts, an erase pulse is first applied only to the memory cells connected to the word line WL0 (S1). The conditions at this time are: a voltage of −9 V applied to the word line WL0 and a voltage of 4 V applied to the common source line SL0. Also, a reference voltage (0 V, in this example) is applied to the other word lines WL1, . . . , WL63. Consequently, the threshold voltages of the memory cells connected to the word line WL0 are lowered. On the other hand, with regard to the memory cells connected to the word lines WL1, . . . , WL63, although the voltage of 4 V is applied to the common source line SL0, the threshold voltages are not lowered because those word lines WL1, . . . , WL63 are applied with the reference voltage (0 V). It is to be noted that the pre-erase program operation is executed according to the prior art, whereas this operation is not executed in this embodiment (the pre-erase program operation may, of course, be executed in this embodiment).

Next, the first verify operation is executed to verify whether all the memory cells connected to the word line WL0 have their respective thresholds, Vt, of not higher than 2.5 V (S2). If there are memory cells (bits), even one, having their respective threshold voltages higher than 2.5 V, then the erase pulse is applied again to the word line WL0 (S1). Then, this erase pulse application and the first verify operation are repeated until the threshold voltages of all the memory cells connected to the word line WL0 become 2.5 V or lower. In this case, the first verify operation is executed every word line, and therefore, the number of memory cells which may be determined to have undergone insufficient erasure is limited to one per bit line. Therefore, the threshold voltages of all the memory cells connected to the word line WL0 can surely be made equal to or lower than 2.5 V.

Next, the second verify operation is executed to verify whether or not the memory cells connected to the word line WL0 all have a threshold voltage of not lower than 0.5 V (S3). The reason why this second verify operation is executed is that the NOR type array is not permitted to include a memory cell having a substantially negative threshold voltage, as described in connection with the background art. The value of 0.5 V is a value necessary for providing a margin such that a problem does not occur even when the voltage Vss rises as a consequence of the generation of noises or the like in the array.

Now assume that the threshold voltages of the memory cells connected to the word line WL0 have a distribution including a threshold voltage equal to or lower than 0.5 V as shown in FIG. 6A. In this case, at the point of time when a memory cell that has a threshold voltage of not higher than 0.5 V is found, the soft program operation is executed for the memory cell (S4). Then, it is confirmed that the threshold voltage of the memory cell becomes equal to or higher than 0.5 V. It is to be noted that the verify operation and the soft program operation are repeated until the threshold voltage becomes equal to or higher than 0.5 V. In this case, the second verify operation is executed every word line, and therefore, the number of memory cells which may be determined to have undergone excessive erasure is limited to one per bit line (this has not been able to be achieved before). Therefore, the soft program operation is executed only for the memory cell that has undergone excessive erasure, and no soft program operation is executed for memory cells that have not undergone excessive erasure. Even if there are many memory cells that have a negative threshold voltage among the memory cells connected to an identical bit line, the soft program operation can correctly be executed. Consequently, as shown in FIG. 6B, the threshold voltage of the memory cell that has undergone excessive erasure can be shifted to fall in the target range (tolerance prescribed for the threshold voltage of the memory cell in the erased state) of 0.5 V to 2.5 V. On the other hand, the threshold voltage of the memory cell that has not undergone excessive erasure can be kept intact at the value.

Next, the address counter n is incremented to make the processing flow proceed to the next word line WL1 (S5 and S6). Then, the same processing as described above is repeated on the next word line WL1 (S1 through S4). That is, the erase pulse is first applied only to the word line WL1 (S1). In other words, by applying a voltage of −9 V to the word line WL1 and a voltage of 4 V to the source line, the threshold voltages of the memory cells connected to the word line WL1 are lowered. On the other hand, the reference voltage (0 V) is applied to the other word lines WL0, WL2, . . . , and WL63. Subsequently, similarly to the case of the word line WL0, the memory cells connected to the word line WL1 are subjected to the first verify operation (S2) for verifying whether the threshold voltage has been shifted to a value of not higher than 2.5 V by the erase pulse application and the second verify operation (S3) for verifying whether the excessive erasure reducing the threshold voltage to lower than 0.5 V has occurred due to the erase pulse application. Further, when a memory cell that has undergone excessive erasure is found by the second verify operation, the soft program operation (S4) is executed for the memory cell. Then, it is verified whether the threshold voltage of the memory cell becomes equal to or higher than 0.5 V. It is to be noted that the verify operation and the soft program operation are repeated until the threshold voltage becomes equal to or higher than 0.5 V. By so doing, the threshold voltages of the memory cells connected to the word line WL1 are made to fall within the range of 0.5 V to 2.5 V.

Once the processing of the word line WL1 ends, the address counter n is further incremented by one (S5). The processing steps are performed word line by word line (S6) up to the word line WL63 of the last address (S7 through S10). As a result, the threshold voltages of all the memory cells in the block come to fall within the target range of 0.5 V to 2.5 V (The erase operation ends.). Therefore, even if the threshold voltage distribution of the memory cells in the block varies, the erase operation can be completed correctly. Therefore, a misread after the erase operation is avoided.

Figure 16:
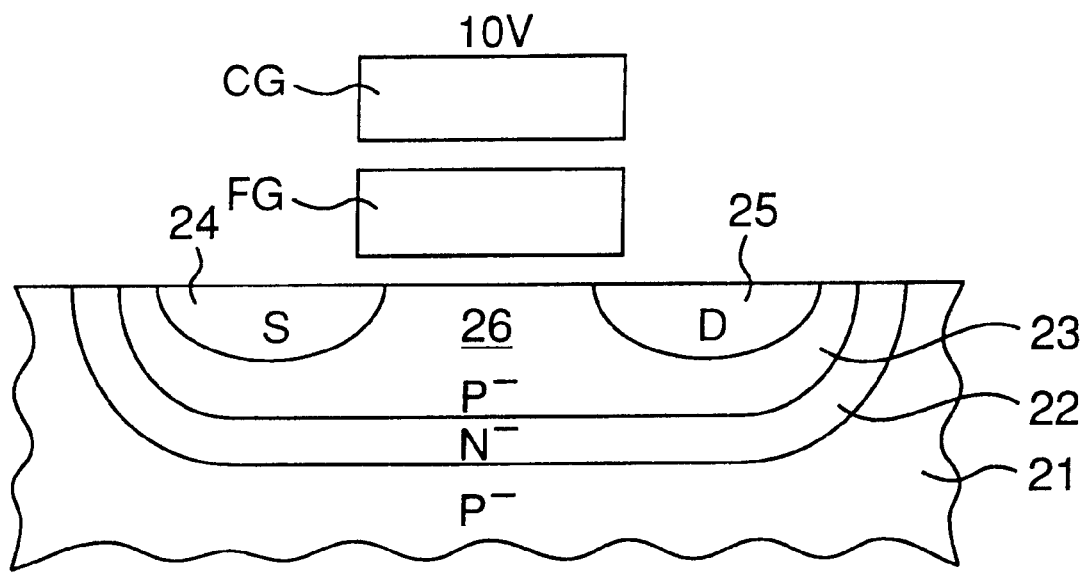
FIG. 16 is a diagram showing the triple well structure of a memory cell that constitutes a flash memory.
Figure 17:
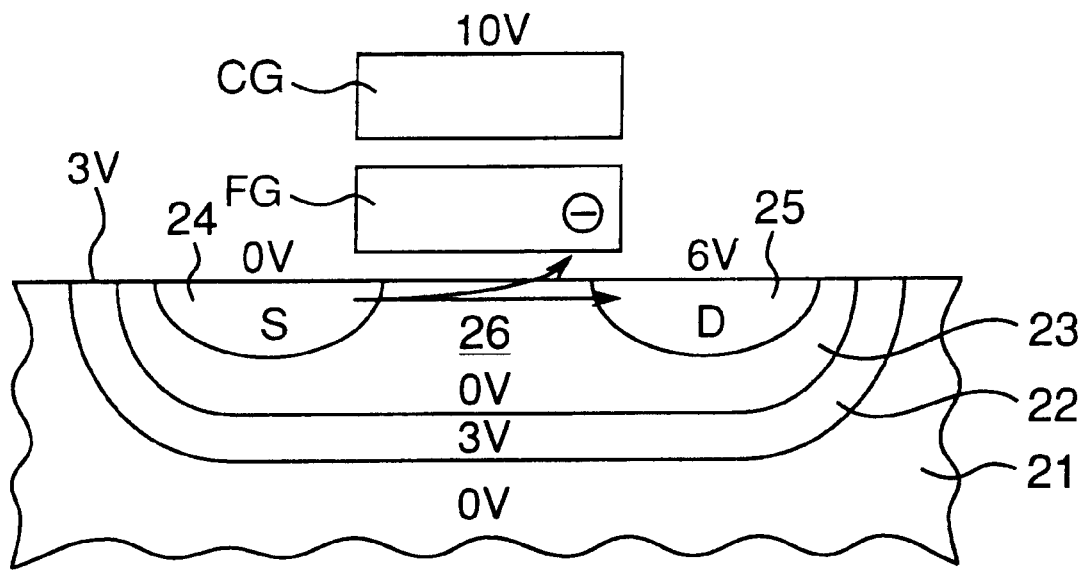
FIG. 17 is a diagram showing a write operation in the memory cell that has the triple well structure.

The erase operation of this first embodiment can also be applied to a memory cell array constructed of memory cells that have a triple well structure as shown in FIG. 16. Therefore, the following description will be made using the reference numerals shown in FIG. 16 for the sake of convenience. The soft program operation for the individual memory cells that have the triple well structure applies a voltage of 6 V to the control gate CG (word line), a voltage of 6 V to the drain 25 (bit line), a voltage of 0 V to the source 24 (common source line), a voltage of 0 V to the P-well 23 and a voltage of 3 V to the N-well 22, similarly to the case shown in FIG. 20. By this operation, channel hot electrons are generated and the electrons are injected into the floating gate FG, thereby slightly raising the threshold voltage. A voltage of 0 V is applied to the drains 25 (bit lines) of the non-selected memory cells (which are subjected to no soft program operation).

(Second Embodiment)

In the first embodiment, as shown in FIG. 6B, the threshold voltages of the memory cells in the erased state could be put into the target range of 0.5 V to 2.5 V. However, as the operating voltage of the nonvolatile semiconductor memory is reduced, the threshold voltage of the memory cell in the erased state is also required to be reduced. Moreover, the source side erase has mainly been described in connection with the first embodiment, and with the finer patterning associated with the reduction of the memory cell area, there is a growing demand for the channel erase. Accordingly, in connection with this second embodiment, an example will be described in which the target range of the threshold voltage in the erased state is 0.5 V–1.5 V and the channel erase is adopted.

It is assumed that a flash memory that serves as a nonvolatile semiconductor memory device to which the erase method of this second embodiment is to be applied has the array structure shown in FIG. 4 and that the memory cells M00, M01, . . . are of the type that has a triple well structure similar to the structure shown in FIG. 16. Therefore, the following description will be made using the reference numerals shown in FIGS. 4 and 16. In the memory cell of this triple well structure, an N-well 22 is formed in a P-type substrate 21, and a P-well 23 is formed within the N-well 22. Further, a source 24 and a drain 25 are formed in the P-well 23, occupying surface portions of the P-well 23. On a channel region 26 located between the source and the drain, a floating gate FG is formed with the interposition of a tunnel oxide film (not shown) therebetween, and a control gate CG is further formed with the interposition of an interlayer insulation film (not shown) between the gates FG and CG.

Figure 18:
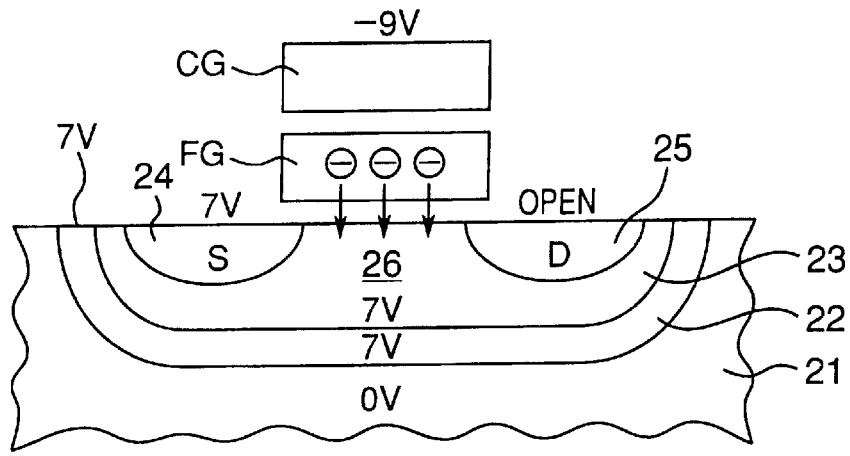
FIG. 18 is a diagram showing a channel erase operation in the memory cell that has the triple well structure.

The write (i.e., program) operation and the read operation for individual memory cells that have the triple well structure are executed according to the principle of operation as described in connection with the background art. Moreover, the erase pulse application (for the channel erase) to the memory cell having the triple well structure during the erase operation is executed using the application voltage conditions shown in Table 4 below, as in the case shown in FIG. 18. It should be understood that the voltages shown in Table 4 are not limitative.

TABLE 4

| Erase Pulse Application Conditions for Channel Erase | | | | |
| --- | --- | --- | --- | --- |
| | Control Gate | Drain | Source | P-well |
| Erase | –9 V | Open | 7 V | 7 V |

That is, a voltage Vnn (–9 V) is applied to the control gate CG (word line) and a voltage Vesc (+7 V) to the source 24 and the N-well 22. By this operation, an intense electric field is applied to the tunnel oxide film located between the channel region 26 and the floating gate FG, and electrons are extracted from the floating gate FG to the channel region 26 by the Fowler-Nordheim tunneling phenomenon, lowering the threshold voltage. At this time, the potential of the source 24 and the potential of the P-well 23 are equal to each other. Therefore, the electric field does not concentrate in a boundary portion between the source 24 and the P-well 23, and no band to band tunneling current is generated. Consequently, hot holes are neither generated nor trapped, and the reliability of the memory cell is improved. It is to be noted that a voltage of, for example, 0 V (or a positive voltage lower than the voltage applied to the source and the P-well) is applied as a reference voltage to the control gates CG (word lines) of the non-selected (non-erased) memory cells. Also, during this erase operation, a voltage equal to or higher than the voltage Vesc (+7 V) is applied to the N-well 22 such that the voltage of the P-well 23 is not applied to the substrate.

Figure 20:
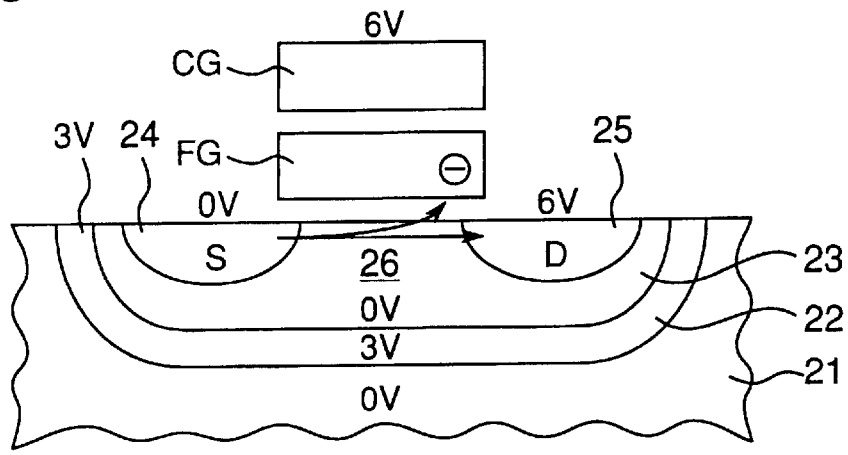
FIG. 20 is a diagram showing a soft program operation in the memory cell that has the triple well structure.
Figure 21:
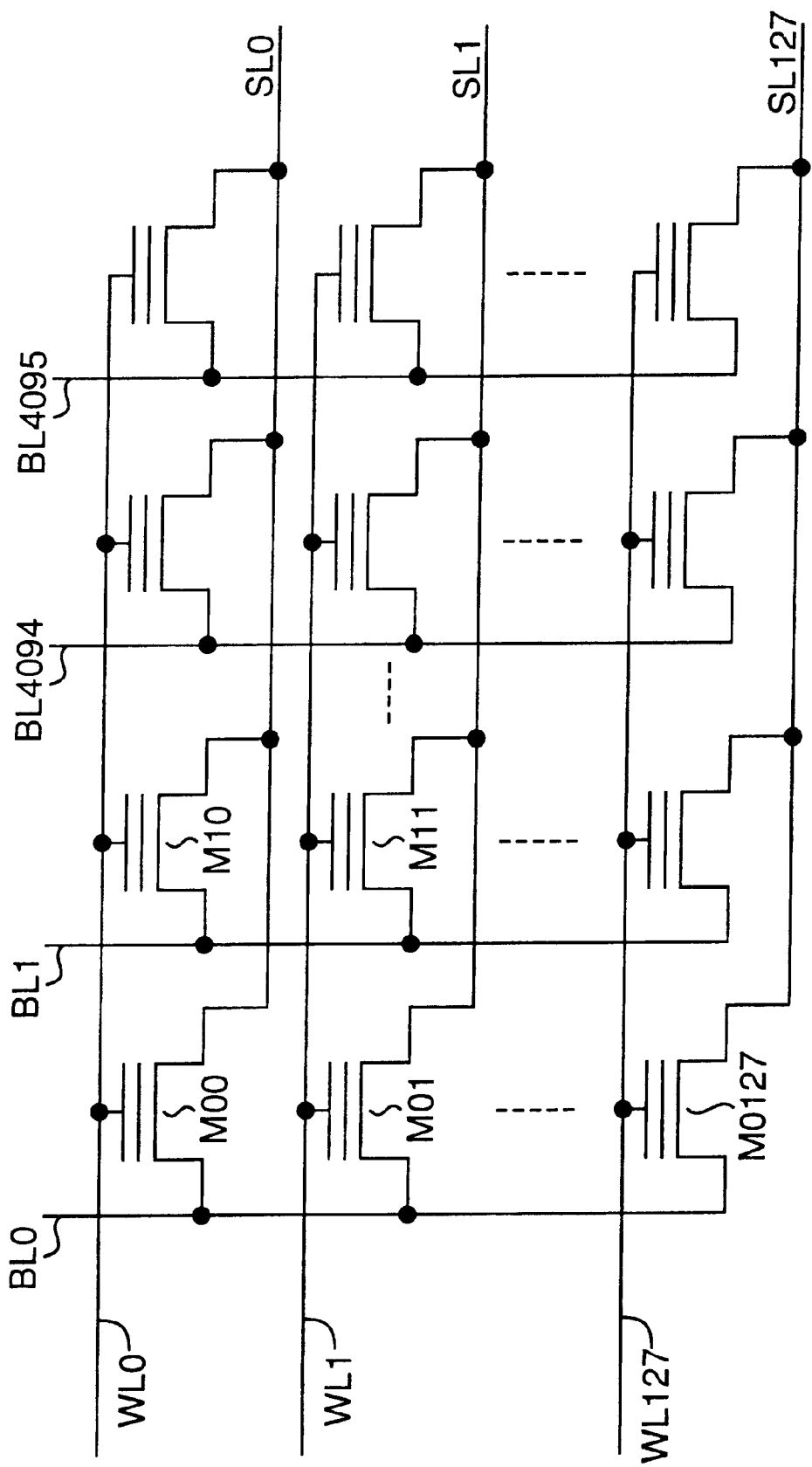
FIG. 21 is a diagram showing the array structure of a prior art flash memory.
Figure 22:
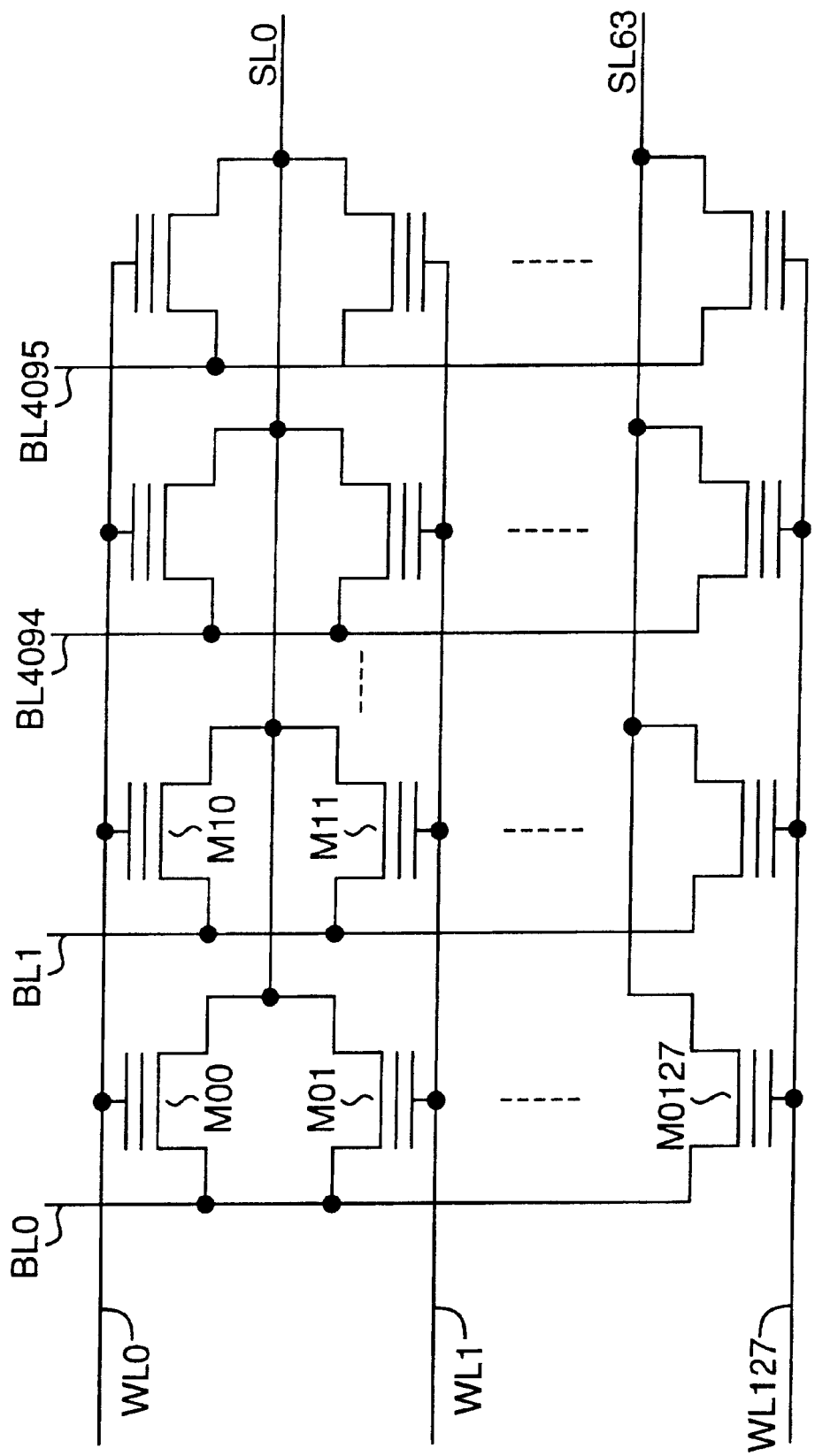
FIG. 22 is a diagram showing the array structure of a prior art flash memory.

During the erase operation, the soft program operation for the memory cell having the triple well structure is performed by applying a voltage of 6 V to the control gate CG (word line), a voltage of 6 V to the drain 25 (bit line), a voltage of 0 V to the source 24 (common source line), a voltage of 0 V to the P-well 23 and a voltage of 3 V to the N-well 22, similarly to the case of FIG. 20. The application of such voltages generates channel hot electrons, and the electrons are injected into the floating gate FG and slightly raise the threshold voltage. A voltage of 0 V is applied to the drains 25 (bit lines) of the non-selected memory cells (in which no soft program is executed).

Figure 2:
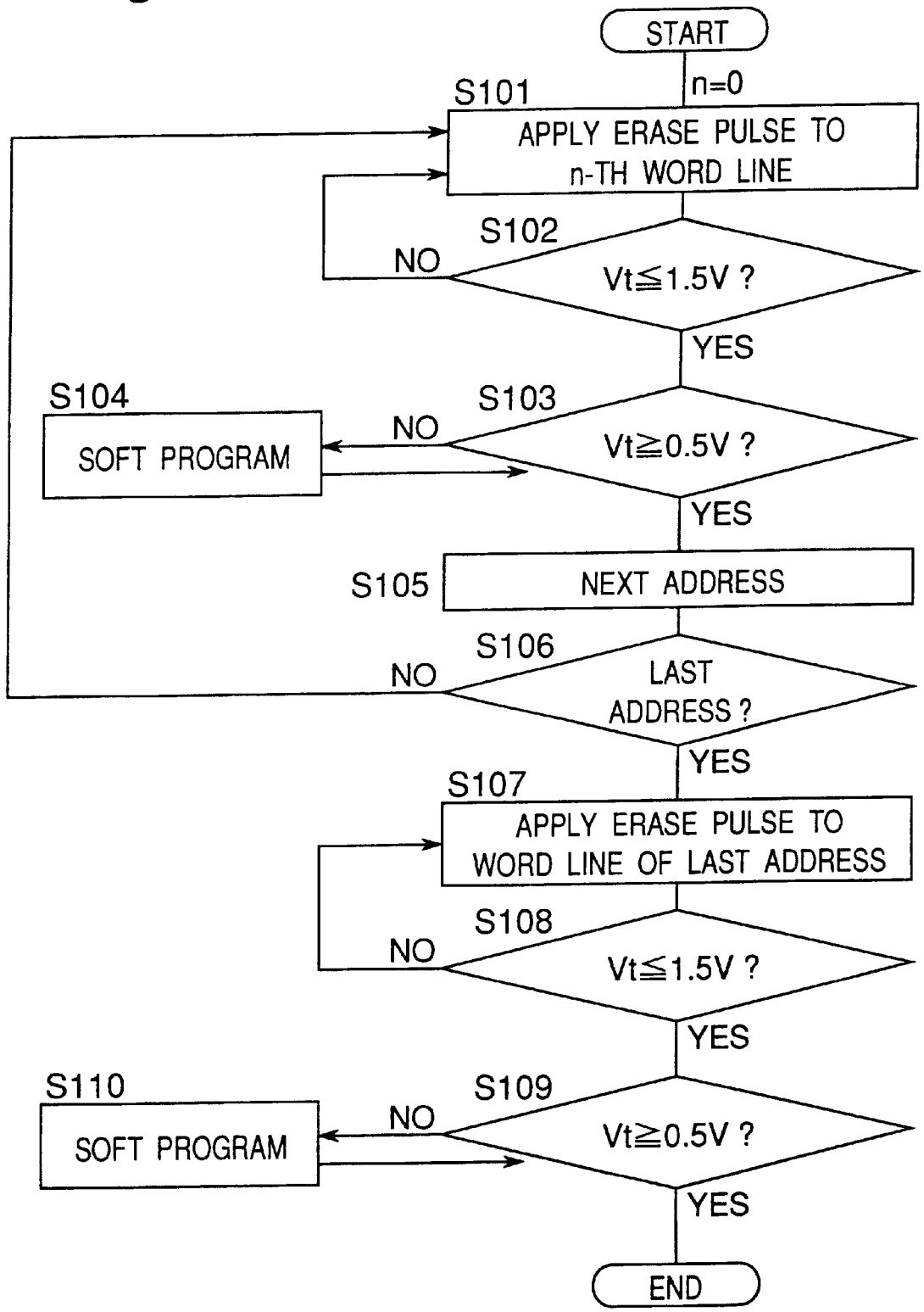
FIG. 2 is a flowchart showing an algorithm of an erase operation according to a second embodiment of the present invention.

FIG. 2 shows an algorithm of the erase operation of the second embodiment.

In this second embodiment as well, the flash memory is provided with a counter for indicating a word line address n, and the word lines are sequentially selected according to the counter value n.

When the erase operation starts, the erase pulse is first applied only to the memory cells connected to the word line WL0 (S101). The voltage application conditions at this time are: a voltage of, for example, –9 V for the word line WL0 and a voltage of 7 V for the common source lines SL0, the P-well 23 and the N-well 22. Also, a reference voltage (0 V, for example) is applied to the other word lines WL1, . . . , WL63 in the block. Consequently, the threshold voltages of the memory cells connected to the word line WL0 are lowered. On the other hand, with regard to the memory cells connected to the word lines WL1, . . . , and WL63, although the voltage of 7 V is applied to the common source line SL0, the threshold voltages are not lowered because those word lines WL1, and WL63 are applied with the reference voltage (0 V). It is to be noted that the pre-erase program operation is executed according to the prior art, whereas this operation is not executed in this embodiment (the pre-erase program operation may, of course, be executed in this embodiment).

Next, the first verify operation is executed to verify whether all the memory cells connected to the word line WL0 have their respective thresholds not higher than 1.5 V (S102). If there are memory cells, even one bit, having threshold voltages higher than 1.5 V, then the erase pulse is applied again to the word line WL0 (S101). Then, this erase pulse application and the first verify operation are repeated until the threshold voltages of all the memory cells connected to the word line WL0 become equal to or lower than 1.5 V. In this case, the first verify operation is executed every word line, and therefore, the number of memory cells which may be determined to have undergone insufficient erasure is limited to one per bit line. Therefore, the threshold voltages of all the memory cells connected to the word line WL0 can surely be made equal to or lower than 1.5 V.

Next, the second verify operation is executed to verify whether or not the memory cells connected to the word line WL0 all have a threshold voltage of not lower than 0.5 V (S103). The reason why this second verify operation is executed is that the NOR type array is not permitted to include a memory cell having a substantially negative threshold voltage, as described in connection with the background art. The value of 0.5 V is a value necessary for providing a margin such that a problem does not occur even when the voltage Vss rises as a consequence of the generation of noises or the like in the array.

Now assume that the threshold voltages of the memory cells connected to the word line WL0 have a distribution including a threshold voltage equal to or lower than 0.5 V as shown in FIG. 7A. In this case, at the point of time when a memory cell that has a threshold voltage of not higher than 0.5 V is found, the soft program operation is executed for the memory cell (S104). Then, it is confirmed that the threshold voltage of the memory cell becomes equal to or higher than 0.5 V. It is to be noted that the verify operation and the soft program operation are repeated until the threshold voltage becomes equal to or higher than 0.5 V. In this case, the second verify operation is executed every word line, and therefore, the number of memory cells which may be determined to have undergone excessive erasure is limited to one per bit line (this has not been able to be achieved before). Therefore, the soft program operation is executed only for the memory cell that has undergone excessive erasure, and no soft program operation is executed for memory cells that have not undergone excessive erasure. Even if there are many memory cells that have a negative threshold voltage among the memory cells connected to an identical bit line, the soft program operation can correctly be executed. Consequently, as shown in FIG. 7B, the threshold voltage of the memory cell that has undergone excessive erasure can be shifted to fall in the target range (tolerance prescribed for the threshold voltage of the memory cell in the erased state) of 0.5 V to 1.5 V. On the other hand, the threshold voltage of the memory cell that has not undergone excessive erasure can be kept intact at the value.

Next, the address counter n is incremented to make the processing flow proceed to the next word line WL1 (S10S and S106). Then, the same processing as described above is repeated on the next word line WL1 (S101 through S104). That is, the erase pulse is first applied only to the word line WL1 (S101). In other words, by applying a voltage of −9 V to the word line WL1 and a voltage of 7 V to the common source line SL0, the P-well 23 and the N-well 22, the threshold voltages of the memory cells connected to the word line WL1 are lowered. On the other hand, the reference voltage (0 V) is applied to the other word lines WL0, WL2, . . . , and WL63. Subsequently, similarly to the case of the word line WL0, the memory cells connected to the word line WL1 are subjected to the first verify operation (S102) for verifying whether the threshold voltage has been shifted to a value of not higher than 1.5 V by the erase pulse application and the second verify operation (S103) for verifying whether the excessive erasure reducing the threshold voltage to lower than 0.5 V has occurred due to the erase pulse application. Further, when a memory cell that has undergone excessive erasure is found by the second verify operation, the soft program operation (S104) is executed for the memory cell. Then, it is verified whether the threshold voltage of the memory cell becomes equal to or higher than 0.5 V. It is to be noted that the verify operation and the soft program operation are repeated until the threshold voltage becomes equal to or higher than 0.5 V. By so doing, the threshold voltages of the memory cells connected to the word line WL1 are made to fall within the range of 0.5 V to 1.5 V.

Once the processing of the word line WL1 ends, the address counter n is further incremented by one (S105). The processing steps are performed word line by word line (S106) up to the word line WL63 of the last address (S107 through S110). As a result, the threshold voltages of all the memory cells in the block come to fall within the target range of 0.5 V to 1.5 V (The erase operation ends.). Therefore, even if the threshold voltage distribution of the memory cells in the block varies, the erase operation can be completed correctly. Therefore, a misread after the erase operation is avoided.

(Third Embodiment)

Figure 5:
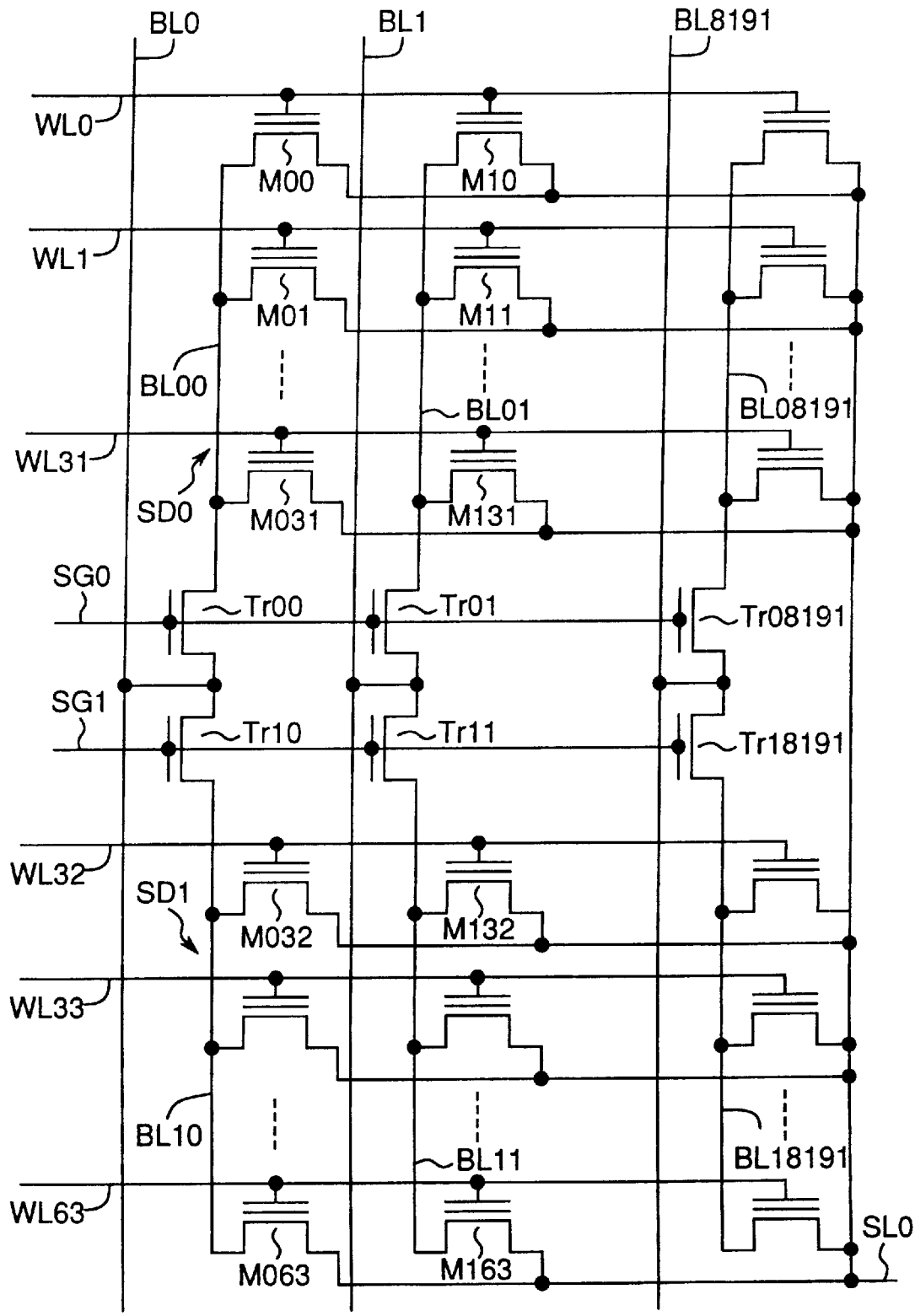
FIG. 5 is a diagram showing the array structure of a flash memory to which the erase operation of the third embodiment of the present invention is to be applied.
Figure 8:
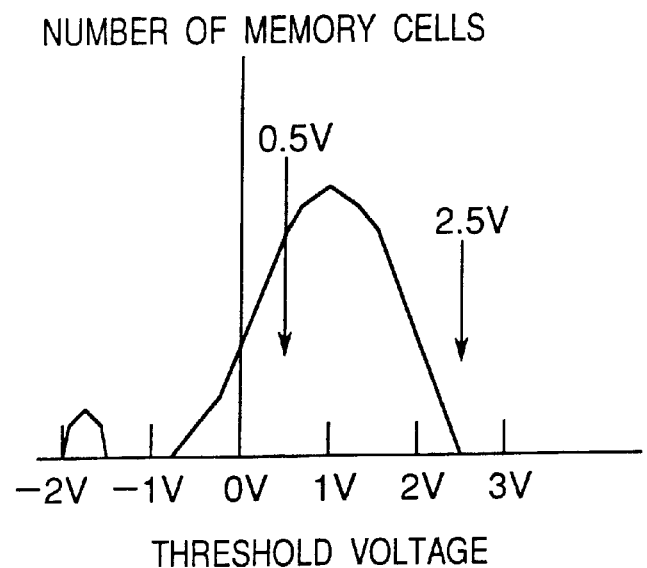
FIG. 8 is a graph showing a threshold voltage distribution of a flash memory where some memory cells have extremely low threshold voltages.
Figure 9:
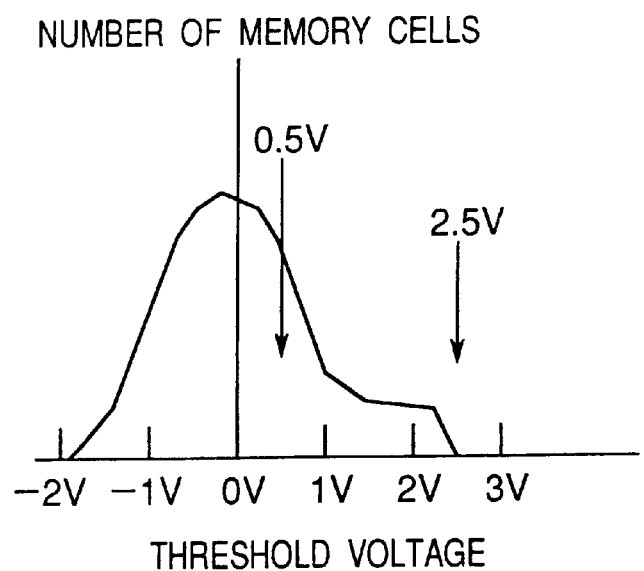
FIG. 9 is a graph showing a threshold voltage distribution of a flash memory where a majority of memory cells have negative threshold voltages.
Figure 10:
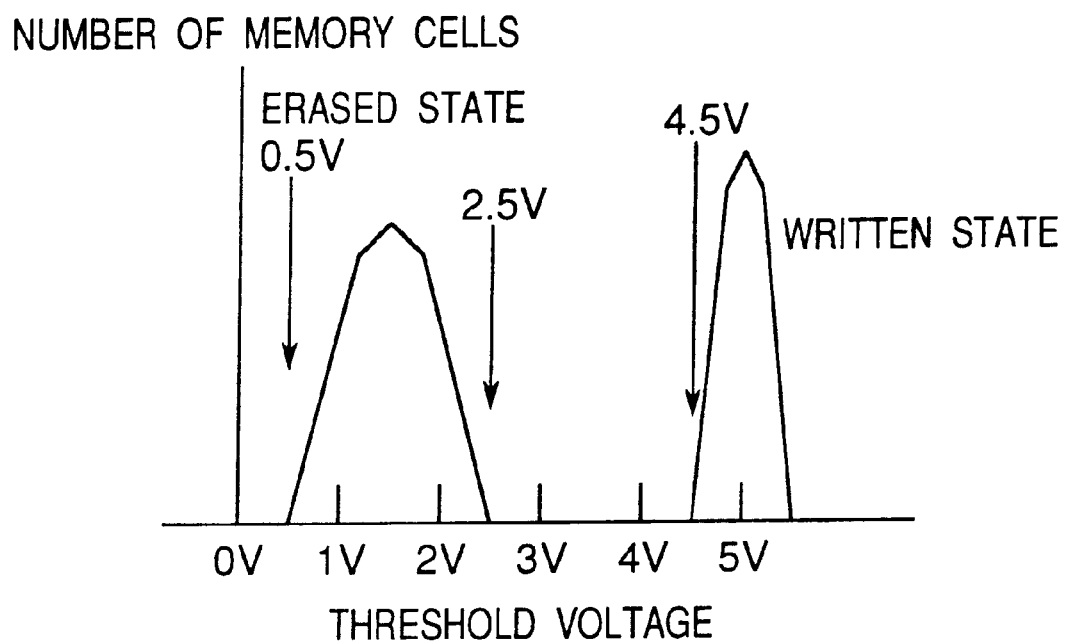
FIG. 10 is a graph showing a standard threshold voltage distributions of memory cells in a written state and an erased state in a flash memory.

FIG. 5 shows the array structure (of one block) of a flash memory that serves as a nonvolatile semiconductor memory device to which the erase method of the first embodiment is to be applied. Each block of this flash memory includes memory cells M00, M01, . . . , M063, M10, M11, . . . constructed of floating gate field-effect transistors arranged in a matrix form. Word lines WL0, WL1, . . . , WL63 are connected to the control gates CG of the memory cells in each row, while bit lines (main bit lines) BL0, BL1, . . . , BL8191 are connected to the drains of the memory cells in each column. The sources of the memory cells are connected to a common source line SL0 in each block, and the memory cells in each block are connected together in a NOR type form. This block of 64 KB (512 kbit) constructed of 64 word lines and 8192 bit lines serves as a unit of erase.

The construction of this flash memory differs from the construction shown in FIG. 4 in that the blocks are divided into two segments SD0 and SD1 in the direction of rows, and each main bit line (BL0, for example) in the block diverges into (in other words, is connected to) two sub-bit lines BL00 and BL10 via select transistors Tr00 and Tr10, respectively. The sub-bit line BL00 is connected to the drains of the memory cells M00, . . . , M031 included in the segment SD0 corresponding to the sub-bit line BL00, while the sub-bit line BL10 is connected to the drains of the memory cells M032, . . . , M063 included in the segment SD1 corresponding to the sub-bit line BL10. Likewise, with regard to the other bit lines, the main bit lines BL1, BL8191 diverge into two sub-bit lines BL01, BL11; . . . ; BL08191, BL18191 via respective select transistors Tr01, Tr11; . . . ; Tr08191, Tr18191. These sub-bit lines BL01, BL11; ... ; BL08191, BL18191 are connected to the drains of the memory cells included in the corresponding segments.

Figure 11:
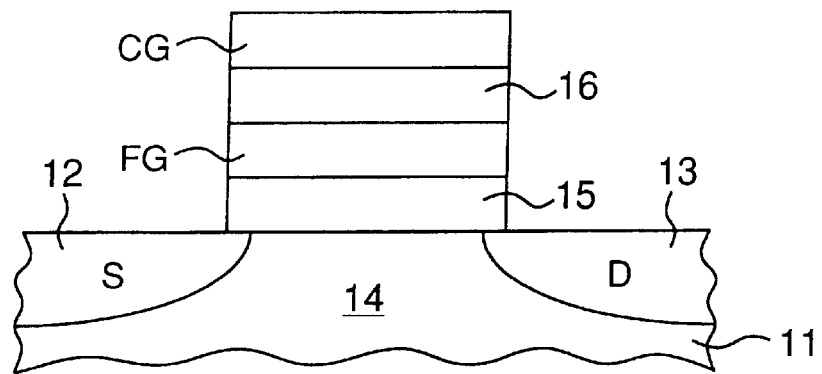
FIG. 11 is a diagram showing a basic structure of a memory cell of a flash memory.
Figure 12:
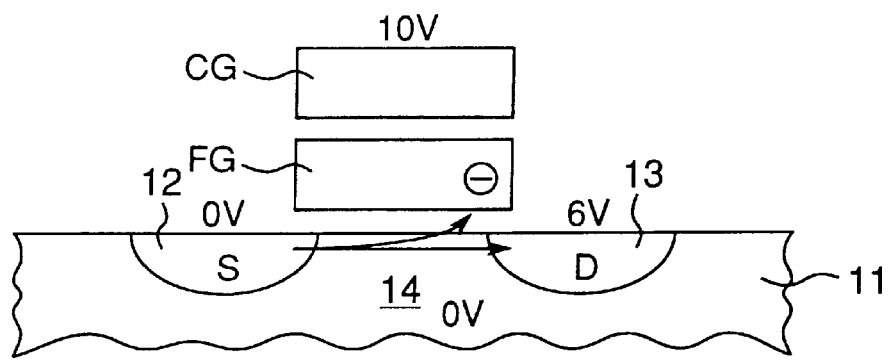
FIG. 12 is a diagram showing a write operation in the memory cell of the basic structure.
Figure 13:
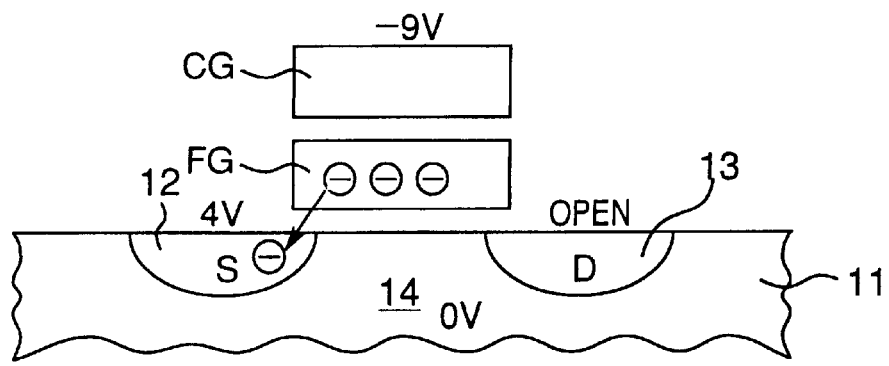
FIG. 13 is a diagram showing a source side erase operation in the memory cell of the basic structure.

In this example, the memory cells M00, M01, ... are of a basic structure similar to that shown in FIG. 11, as in the first embodiment. The write (program) operation, the erase operation and the read operation for the individual memory cells in this embodiment are executed using the application voltage conditions shown in Table 3 according to a principle of operation similar to that of the first embodiment.

Figure 3:
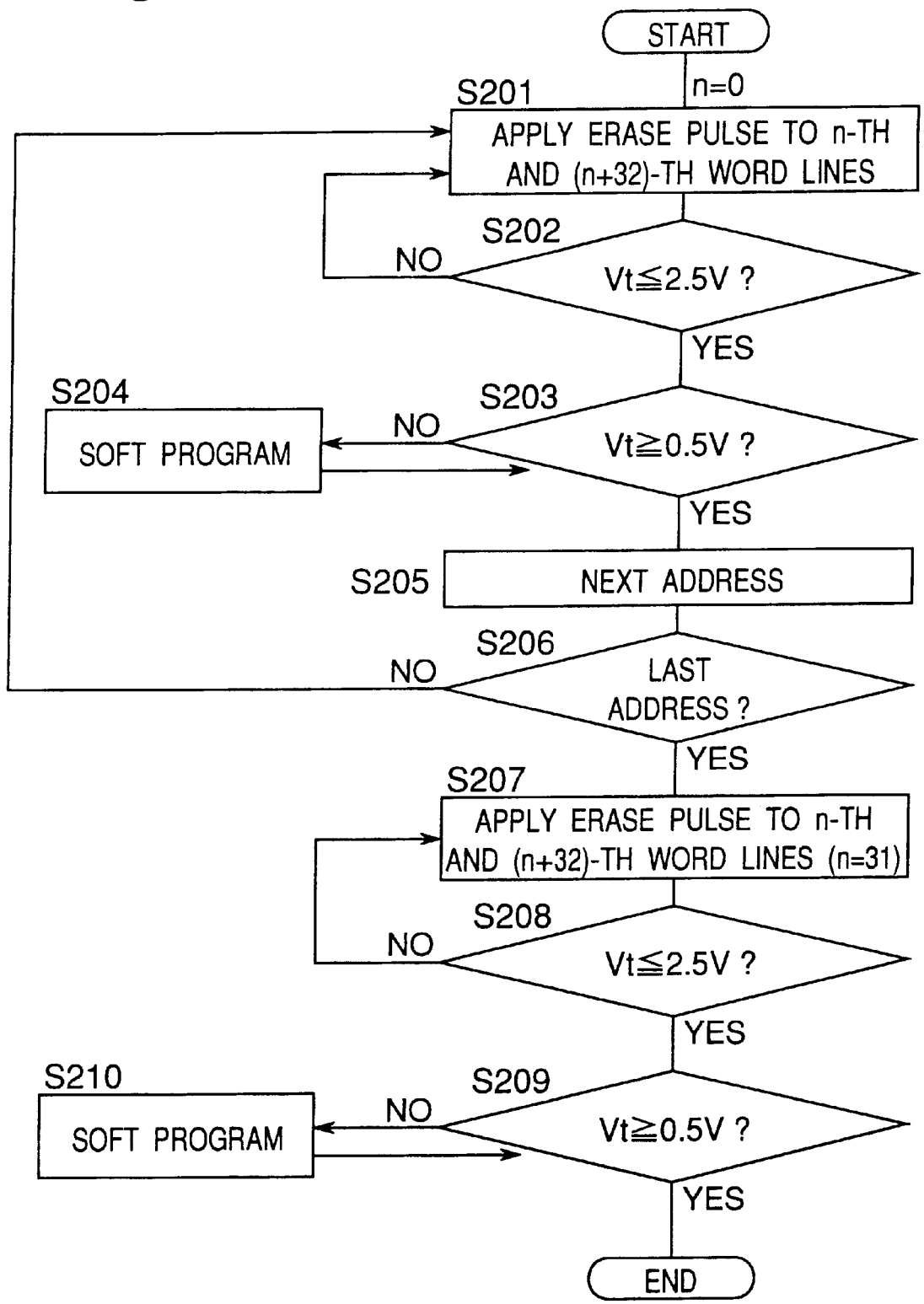
FIG. 3 is a flowchart showing an algorithm of an erase operation according to a third embodiment of the present invention.

FIG. 3 shows an algorithm of the erase operation of the third embodiment.

In the third embodiment as well, the flash memory is provided with a counter for indicating a word line address n, and the word lines are sequentially selected according to the counter value n. In contrast to the first and second embodiments in which the word line selection is executed one by one, two word lines are simultaneously selected in order to increase the erase speed in the third embodiment.

Once the erase operation starts, an erase pulse is first applied only to the memory cells connected to two word lines WL0 and WL32 (S201). The voltage application conditions at this time are: a voltage of, for example, −9 V for the word lines WL0 and WL32 and a voltage of 4 V for the common source line SL0. It is to be noted that the select transistors Tr01, Tr10; Tr01, Tr11; ... ; Tr08191, Tr18191 are allowed to be in the OFF state in order to put the drains of the memory cells in the open state during the erase operation. A reference voltage (0 V in this example) is applied to the other word lines WL1, ... , WL31, WL33, ... , WL63. Consequently, the threshold voltages of the memory cells connected to the word lines WL0 and WL32 are lowered. On the other hand, with regard to the memory cells connected to the word lines WL1, ... , WL31, WL33, ... , WL63, although a voltage of 4 V is applied to the common source line SL0, their respective threshold voltages are not lowered because those word lines WL1, WL31, WL33, ... , WL63 are applied with the reference voltage (0 V). It is to be noted that the pre-erase program operation is executed according to the prior art, whereas this operation is not executed in this embodiment (the pre-erase program operation may, of course, be executed in this embodiment).

Next, the first verify operation is executed to verify whether all the threshold voltages of the memory cells connected to the word lines WL0 and WL32 are equal to or lower than 2.5 V (S202). Specifically, a select line SG0 for the segment SD0 is made to have a voltage of 3 V to turn on the select transistors Tr00, Tr01, ... , Tr08191, while a select line SGl for the segment SD1 is made to have a voltage of 0 V to turn off the select transistors Tr10, Tr11, ... , Tr18191. Thus, the memory cells connected to the word line WL0 are verified. Subsequently, the select line SG0 for the segment SD0 is made to have a voltage of 0 V to turn off the select transistors Tr00, Tr01, Tr08191, while the select line SG1 for the segment SD1 is made to have a voltage of 3 V to turn on the select transistors Tr10, Tr11, ... , Tr18191. Thus, the memory cells connected to the word line WL32 are verified. If there are memory cells (bits), even one, having their respective threshold voltages higher than 2.5 V, then the erase pulse is applied again to the word lines WL0 and WL32 (S201). Then, this erase pulse application and the first verify operation are repeated until the threshold voltages of all the memory cells connected to the word lines WL0 and WL32 become 2.5 V or lower. In this embodiment the erase pulse is applied to two word lines at the same time, but the first verify operation is executed every word line. Therefore, the number of memory cells which may be determined to have undergone insufficient erasure is limited to one per bit line. Therefore, the threshold voltages of all the memory cells connected to the word lines WL0 and WL32 can surely be made equal to or lower than 2.5 V.

Next, the second verify operation is executed to verify whether or not the memory cells connected to the word line WL0 and WL32 all have a threshold voltage of not lower than 0.5 V (S203). The reason why this second verify operation is executed is that the NOR type array is not permitted to include a memory cell having a substantially negative threshold voltage, as described in connection with the background art. The value of 0.5 V is a value necessary for providing a margin such that a problem does not occur even when the voltage Vss rises as a consequence of the generation of noises or the like in the array. Specifically, similar to the first verify operation, the select line SG0 for the segment SD0 is made to have a voltage of 3 V to turn on the select transistors Tr00, Tr01, ... , Tr08191, while the select line SG1 for the segment SD1 is made to have a voltage of 0 V to turn off the select transistors Tr10, Tr11, ... , Tr18191. Thus, the memory cells connected to the word line WL0 are verified. Subsequently, the select line SG0 for the segment SD0 is made to have a voltage of 0 V to turn off the select transistors Tr00, Tr01, ... , Tr08191, while the select line SG1 for the segment SD1 is made to have a voltage of 3 V to turn on the select transistors Tr10, Tr11, ... , Tr18191. Thus, the memory cells connected to the word line WL32 are verified.

Now assume that the threshold voltages of the memory cells connected to the word line WL0 or WL32 have a distribution including a threshold voltage equal to or lower than 0.5 V as shown in FIG. 6A. In this case, at the point of time when a memory cell that has a threshold voltage of not higher than 0.5 V is found, the soft program operation is executed for the memory cell (S204). Then, it is confirmed that the threshold voltage of the memory cell becomes equal to or higher than 0.5 V. It is to be noted that the verify operation and the soft program operation are repeated until the threshold voltage becomes equal to or higher than 0.5 V.

Specifically, if the memory cells connected to the word line WL0 in the segment SD0 include a memory cell that has undergone excessive erasure and the soft program operation is executed for the excessively erased memory cell (assumed to be M00), the select line SG0 on the segment SD0 side is made to have a voltage of 7 V to turn on the select transistors Tr00, Tr01, ... , Tr08191, while the select line SG1 on the segment SD1 side is made to have a voltage of 0 V to turn off the select transistors Tr10, Tr11, ... , Tr18191. Then, there are applied a voltage of 6 V to the word line WL0, a voltage of 0 V to the common source line SL0, and a voltage of 6 V to the main bit line BL0. At this time, because a select gate transistor TR00 is in an on state, the memory cell M00 is subjected to the soft program operation. The soft program operation is executed in the memory cells connected to the word line WL0 in this manner.

Although the erase pulse is simultaneously applied to the two word lines WL0 and WL32 in this third embodiment, the second verify operation is executed every word line. the number of memory cells which may be determined to have undergone excessive erasure is limited to one per main bit line (this has not been able to be achieved before). Therefore, the soft program operation is executed only for the memory cell that has undergone excessive erasure, and no soft program operation is executed for memory cells that have not undergone excessive erasure. Even if there are many memory cells that have a negative threshold voltage among the memory cells connected to an identical bit line, the soft program operation can correctly be executed. Consequently, as shown in FIG. 6B, the threshold voltage of the memory cell that has undergone excessive erasure can be shifted to fall in the target range (tolerance prescribed for the threshold voltage of the memory cell in the erased state) of 0.5 V to 2.5 V. On the other hand, the threshold voltage of the memory cell that has not undergone excessive erasure can be kept intact at the value.

Next, the address counter n is incremented to make the processing flow proceed to the next two word lines WL1 and WL33 (S205 and S206). Then, the same processing as described above is repeated on the next two word lines WL1 and WL33 (S201 through S204). That is, the erase pulse is first applied only to these two word lines WL1 and WL33 (S201). In other words, by applying a voltage of −9 V to the word lines WL1 and WL33 and a voltage of 4 V to the common source line SL0, the threshold voltages of the memory cells connected to the word lines WL1 and WL33 are lowered. On the other hand, the reference voltage (0 V) is applied to the other word lines WL0, WL2, . . . , and WL31; WL32, WL34, . . . , WL63. Subsequently, similarly to the case of the word lines WL0 and WL32, the memory cells connected to the word lines WL1 and WL33 are subjected to the first verify operation (S202) for verifying whether the threshold voltage has been shifted to a value of not higher than 2.5 V by the erase pulse application and the second verify operation (S203) for verifying whether the excessive erasure reducing the threshold voltage to lower than 0.5 V has occurred due to the erase pulse application. Further, when a memory cell that has undergone excessive erasure is found by the second verify operation, the soft program operation (S204) is executed for the memory cell. Then, it is verified whether the threshold voltage of the memory cell becomes equal to or higher than 0.5 V. It is to be noted that the verify operation and the soft program operation are repeated until the threshold voltage becomes equal to or higher than 0.5 V. By so doing, the threshold voltages of the memory cells connected to the word lines WL1 and WL33 are made to fall within the range of 0.5 V to 2.5 V.

When the processing of the word lines WL1 and WL33 ends, the address counter n is further incremented by one (S205). The processing steps are performed word line by word line (S206) up to the word lines WL31 and WL63 of the last address (S207 through S210). As a result, the threshold voltages of all the memory cells in the block come to fall within the target range of 0.5 V to 2.5 V (The erase operation ends.). Therefore, even if the threshold voltage distribution of the memory cells in the block varies, the erase operation can be completed correctly. Therefore, a misread after the erase operation is avoided. Furthermore, because the erase pulse is applied to two word lines at the same time, the erase operation can be increased in speed by comparison with the first embodiment and the second embodiment.

Although the simultaneous erase pulse application to two word lines has been described in connection with this third embodiment, it is possible to divide each block into m (more than two) segments and execute the simultaneous erase pulse application to m word lines by providing the m segments with respective sub-bit lines that diverge from (namely, are connected to the main bit line) via the respective select transistors. If this arrangement is adopted, the erase operation can further be increased in speed.

It is a matter of course that the erase method of this third embodiment can be applied to a memory cell that has a triple well structure similar to the structure described in connection with the second embodiment and to a memory cell that executes channel erase.

As is apparent from the above, according to the present invention, even if the threshold voltage distribution of the memory cells in a block varies, the erase operation can correctly be completed, preventing the possible occurrence of misread. Furthermore, even if there are many memory cells that have a negative threshold voltage among the memory cells connected to an identical bit line, the soft program can correctly be executed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An erase method for a nonvolatile semiconductor memory device having electrically erasable and programmable floating gate field-effect transistors arranged in a matrix form so as to form a memory cell array, each memory cell having a control gate, a drain and a source, a plurality of word lines connected to the control gates of memory cells in each row, and a plurality of bit lines connected to the drains of memory cells in each column, the memory cell array being divided into a plurality of blocks including the memory cells of a plurality of rows and a plurality of columns, the sources of the memory cells in each block being commonly connected, and the memory cells in each block being commonly connected, and the memory cells in each block being connected together in a NOR type form, said erase method executing an erase operation in blocks and comprising:

executing, for the memory cells connected to one word line in a certain block, an erase pulse application for erasing information, a first verify operation for verifying a threshold voltage shift due to the erase pulse application and a second verify operation for verifying whether excessive erasure has occurred due to the erase pulse application; and executing a soft program operation for the memory cell after the second verify operation and before application of an erase pulse to a next word line when a memory cell that has undergone excessive erasure is found by the second verify operation, said pulse application, said first verify operation, and said second verify operation being executed word line by word line in the block.

2. The erase method as claimed in claim 1, wherein a target range of threshold voltages of each memory cell in an erased state is set lower than a lower limit value of threshold voltages in a written state, the first verify operation verifies that the threshold voltages of the memory cells connected to the word line are equal to or lower than an upper limit value of the target range, and the second verify operation verifies that the threshold voltages of the memory cells connected to the word line are equal to or higher than a lower limit value of the target range.

3. The erase method as claimed in claim 2, wherein the soft program operation is executed by means of channel hot electrons.

4. The erase method as claimed in claim 2, wherein a voltage applied to the control gate of a memory cell in the soft program operation is same in polarity as and smaller in value than a voltage applied to the control gate of the memory cell during a write operation, and a voltage applied to the drain of the memory cell in the soft program operation is substantially identical to a voltage applied to the drain of the memory cell in the write operation.

5. The erase method as claimed in claim 1, wherein the erase pulse application includes applying a first voltage to the sources of a certain block, applying a second voltage to one word line selected from the plurality of word lines of the block, and applying a third voltage to non-selected word lines of the block, to thereby extract electrons from the floating gate to the source of each memory cell connected to the selected word line.

6. The erase method as claimed in claim 5, wherein the first voltage is a positive voltage, the second voltage is a negative voltage and the third voltage is a reference voltage.

7. The erase method as claimed in claim 1, wherein each memory cell constituted of the floating gate field-effect transistor has a triple well structure in which a P-well that provides a channel region is formed via an N-well on a P-type semiconductor substrate, and the erase pulse application includes applying a first voltage to the source and the P-well of a certain block, applying a second voltage to one word line selected from the plurality of word lines of the block, and applying a third voltage to non-selected word lines of the block, to thereby extract electrons from the floating gate to the channel region of each memory cell connected to the selected word line.

8. The erase method as claimed in claim 7, wherein the first voltage is a positive voltage, the second voltage is a negative voltage and the third voltage is a reference voltage or a positive voltage lower than the first voltage.

9. An erase method for a nonvolatile semiconductor memory device having electrically erasable and programmable floating gate filed-effect transistors arranged in a matrix form so as to form a memory cell array, each memory cell having a control gate, a drain and a source, a plurality of word lines connected to the control gates of memory cells in each row, and a plurality of bit lines connected to the drains of memory cells in each column, the memory cell array being divided into a plurality of blocks including the memory cells of a plurality of rows and a plurality of columns, each block being divided into a plurality of segments with respect to a row direction, each bit line consisting of a main bit line and a plurality of sub-bit lines connected to the main bit line via a respective select transistor, the sub-bit lines being connected to the drains of the memory cells included in the corresponding segments, the sources of the memory cells in each block being commonly connected, and the memory cells in each block being connected together in a NOR type form, said erase method executing an erase operation in blocks and comprising:

executing, for the memory cells connected to one word line in each segment of a certain block, an erase pulse application for erasing information, a first verify operation for verifying a threshold voltage shift due to the erase pulse application and a second verify operation for verifying whether excessive erasure has occurred due to the erase pulse application; and executing a soft program operation for the memory cell after the second verify operation and before application of an erase pulse to a next word line when a memory cell that has undergone excessive erasure is found by the second verify operation, said erase pulse application, said first verify operation, said second verify operation, and said soft program operation being executed in the plurality of segments of the block in parallel, and said erase pulse application, said first verify operation being executed word line by word line in each segment of the block.

10. The erase method as claimed in claim 9, wherein a target range of threshold voltages of each memory cell in an erased state is set lower than a lower limit value of threshold voltages in a written state, the first verify operation verifies that the threshold voltages of the memory cells connected to the word line are equal to or lower than an upper limit value of the target range, and the second verify operation verifies that the threshold voltages of the memory cells connected to the word line are equal to or higher than a lower limit value of the target range.

11. The erase method as claimed in claim 9, wherein the first verify operation and the second verify operation for the memory cells connected to the selected word line are executed by turning on the select transistors for the sub-bit lines included in the segment through which the selected word line extends while turning off the select transistors for the sub-bit lines included in remaining segments.

* * * * *